US009689897B2

(12) United States Patent
Rathburn

(10) Patent No.: US 9,689,897 B2
(45) Date of Patent: Jun. 27, 2017

(54) PERFORMANCE ENHANCED SEMICONDUCTOR SOCKET

(71) Applicant: HSIO TECHNOLOGIES, LLC, Maple Grove, MN (US)

(72) Inventor: James Rathburn, Maple Grove, MN (US)

(73) Assignee: HSIO Technologies, LLC, Maple Grove, MN (US)

(*) Notice: Subject to any disclaimer, the term of this patent is extended or adjusted under 35 U.S.C. 154(b) by 280 days.

(21) Appl. No.: 14/565,724

(22) Filed: Dec. 10, 2014

(65) Prior Publication Data
US 2015/0091600 A1 Apr. 2, 2015

Related U.S. Application Data

(63) Continuation-in-part of application No. 13/700,639, filed as application No. PCT/US2011/038845 on Jun.
(Continued)

(51) Int. Cl.
G01R 1/04 (2006.01)

(52) U.S. Cl.
CPC ....... G01R 1/0466 (2013.01); *Y10T 29/49222* (2015.01)

(58) Field of Classification Search
USPC .................. 439/700, 68, 65, 73, 66
See application file for complete search history.

(56) References Cited

U.S. PATENT DOCUMENTS 3,672,986 A * 6/1972 Schneble, Jr. et al. H05K 3/108
174/259
4,188,438 A 2/1980 Burns
(Continued)

FOREIGN PATENT DOCUMENTS

JP 2003/217774 7/2003
WO WO 91/14015 9/1991
(Continued)

OTHER PUBLICATIONS

Notification of Transmittal of the International Search Report and the Written Opinion of the International Searching Authority mailed Jul. 30, 2010 in International Application No. PCT/US2010/036043.
(Continued)

*Primary Examiner* — Alexander Gilman

(57) ABSTRACT

A test socket for IC devices includes a multi-layered socket housing with at least one center layer and first and second surface layers. The first and second surface layers have a thickness and dielectric constant less than that of the center layers. A plurality of contact members are located in center openings in the center layer with distal ends extending into openings in the first and second layers. The distal ends of the contact members having at least one dimension greater than the openings in the first and second surface layers to retain the contact members in the socket housing. The contact members include center portions with major diameters less than the diameters of the center openings, such that an air gap is maintained between the contact members and the center layer.

19 Claims, 7 Drawing Sheets

Related U.S. Application Data 2, 2011, now Pat. No. 9,184,527, application No. 14/565,724, which is a continuation-in-part of application No. 13/410,914, filed on Mar. 2, 2012, now Pat. No. 9,276,336, application No. 14/565,724, which is a continuation-in-part of application No. 13/412,870, filed on Mar. 6, 2012, now Pat. No. 8,758,067.

(60) Provisional application No. 61/914,179, filed on Dec. 10, 2013, provisional application No. 61/351,114, filed on Jun. 3, 2010, provisional application No. 61/448,288, filed on Mar. 2, 2011, provisional application No. 61/449,889, filed on Mar. 7, 2011.

(56) References Cited

U.S. PATENT DOCUMENTS

| | | | |
|---|---|---|---|
| 4,258,468 A * | | 3/1981 | Balde ............... H05K 3/0032 174/266 |
| 4,295,700 A | | 10/1981 | Sado |
| 4,489,999 A | | 12/1984 | Miniet |
| 4,922,376 A | | 5/1990 | Pommer et al. |
| 4,964,948 A | | 10/1990 | Reed |
| 5,014,159 A | | 5/1991 | Butt |
| 5,071,363 A | | 12/1991 | Reylek et al. |
| 5,072,520 A | | 12/1991 | Nelson |
| 5,096,426 A | | 3/1992 | Simpson et al. |
| 5,127,837 A | | 7/1992 | Shah et al. |
| 5,129,573 A | | 7/1992 | Duffey |
| 5,161,983 A | | 11/1992 | Ohno |
| 5,167,512 A * | | 12/1992 | Walkup ............ H01R 13/2421 439/65 |
| 5,208,068 A | | 5/1993 | Davis et al. |
| 5,237,203 A | | 8/1993 | Massaron |
| 5,246,880 A | | 9/1993 | Reele et al. |
| 5,286,680 A | | 2/1994 | Cain |
| 5,302,923 A * | | 4/1994 | Mason ............... H01R 23/688 333/260 |
| 5,334,029 A | | 8/1994 | Akkapeddi et al. |
| 5,358,621 A | | 10/1994 | Oyama |
| 5,378,981 A | | 1/1995 | Higgins, III |
| 5,419,038 A | | 5/1995 | Wang et al. |
| 5,454,161 A | | 10/1995 | Beilin et al. |
| 5,479,319 A | | 12/1995 | Werther et al. |
| 5,509,019 A | | 4/1996 | Yamamura |
| 5,527,998 A | | 6/1996 | Anderson et al. |
| 5,562,462 A | | 10/1996 | Matsuba et al. |
| 5,590,460 A * | | 1/1997 | DiStefano ......... H01R 13/2414 174/262 |
| 5,659,181 A | | 8/1997 | Bridenbaugh |
| 5,674,595 A | | 10/1997 | Busacco et al. |
| 5,691,041 A | | 11/1997 | Frankeny et al. |
| 5,716,663 A | | 2/1998 | Capote et al. |
| 5,741,624 A | | 4/1998 | Jeng et al. |
| 5,746,608 A | | 5/1998 | Taylor |
| 5,761,801 A | | 6/1998 | Gebhardt et al. |
| 5,764,485 A | | 6/1998 | Lebaschi |
| 5,772,451 A | | 6/1998 | Dozler et al. |
| 5,785,538 A | | 7/1998 | Beaman et al. |
| 5,787,976 A | | 8/1998 | Hamburgen et al. |
| 5,802,699 A | | 9/1998 | Fjelstad et al. |
| 5,802,711 A | | 9/1998 | Card et al. |
| 5,819,579 A | | 10/1998 | Roberts |
| 5,904,546 A | | 5/1999 | Wood et al. |
| 5,913,109 A | | 6/1999 | Distefano et al. |
| 5,921,786 A | | 7/1999 | Slocum et al. |
| 5,925,931 A | | 7/1999 | Yamamoto |
| 5,933,558 A | | 8/1999 | Sauvageau et al. |
| 5,973,394 A | | 10/1999 | Slocum et al. |
| 6,020,597 A | | 2/2000 | Kwak |
| 6,062,879 A | | 5/2000 | Beaman et al. |
| 6,080,932 A | | 6/2000 | Smith et al. |
| 6,107,109 A | | 8/2000 | Akram et al. |
| 6,114,240 A | | 9/2000 | Akram et al. |
| 6,118,426 A | | 9/2000 | Albert |
| 6,120,588 A | | 9/2000 | Jacobson |
| 6,137,687 A | | 10/2000 | Shirai et al. |
| 6,172,879 B1 | | 1/2001 | Cilia et al. |
| 6,177,921 B1 | | 1/2001 | Comiskey |
| 6,178,540 B1 | | 1/2001 | Lo et al. |
| 6,181,144 B1 | | 1/2001 | Hembree et al. |
| 6,200,143 B1 | | 3/2001 | Haba et al. |
| 6,207,259 B1 | | 3/2001 | Iino et al. |
| 6,225,692 B1 | | 5/2001 | Hinds |
| 6,247,938 B1 | | 6/2001 | Rathburn |
| 6,252,564 B1 | | 6/2001 | Albert |
| 6,255,126 B1 | | 7/2001 | Mathieu et al. |
| 6,263,566 B1 | | 7/2001 | Hembree et al. |
| 6,270,363 B1 | | 8/2001 | Brofman et al. |
| 6,288,451 B1 | | 9/2001 | Tsao |
| 6,312,971 B1 | | 11/2001 | Amundson |
| 6,313,528 B1 | | 11/2001 | Solberg |
| 6,320,256 B1 | | 11/2001 | Ho |
| 6,350,386 B1 | | 2/2002 | Lin |
| 6,359,790 B1 | | 3/2002 | Meyer-Berg |
| 6,413,790 B1 | | 7/2002 | Duthaler |
| 6,422,687 B1 | | 7/2002 | Jacobson |
| 6,428,328 B2 | | 8/2002 | Haba et al. |
| 6,437,452 B2 | | 8/2002 | Lin |
| 6,437,591 B1 | | 8/2002 | Farnworth et al. |
| 6,459,418 B1 | | 10/2002 | Comiskey |
| 6,461,183 B1 | | 10/2002 | Ohkita |
| 6,462,418 B2 | | 10/2002 | Sakamoto et al. |
| 6,462,568 B1 | | 10/2002 | Cram |
| 6,477,286 B1 | | 11/2002 | Ouchi |
| 6,490,786 B2 | | 12/2002 | Belke et al. |
| 6,494,725 B2 | | 12/2002 | Lin et al. |
| 6,506,438 B2 | | 1/2003 | Duthaler et al. |
| 6,521,489 B2 | | 2/2003 | Duthaler |
| 6,545,291 B1 | | 4/2003 | Amundson |
| 6,572,396 B1 | | 6/2003 | Rathburn |
| 6,574,114 B1 | | 6/2003 | Brindle et al. |
| 6,593,535 B2 | | 7/2003 | Gailus |
| 6,603,080 B2 | | 8/2003 | Jensen |
| 6,614,104 B2 | | 9/2003 | Farnworth et al. |
| 6,626,526 B2 | | 9/2003 | Ueki |
| 6,639,578 B1 | | 10/2003 | Comiskey |
| 6,642,127 B2 | | 11/2003 | Kumar et al. |
| 6,652,075 B2 | | 11/2003 | Jacobson |
| 6,661,084 B1 | | 12/2003 | Peterson et al. |
| 6,662,442 B1 | | 12/2003 | Matsui et al. |
| 6,709,967 B2 | | 3/2004 | Evers |
| 6,744,126 B1 | | 6/2004 | Chiang |
| 6,750,473 B2 | | 6/2004 | Amundson |
| 6,758,691 B1 | | 7/2004 | McHugh |
| 6,773,302 B2 | | 8/2004 | Gutierrez et al. |
| 6,800,169 B2 | | 10/2004 | Liu et al. |
| 6,809,414 B1 | | 10/2004 | Lin et al. |
| 6,821,131 B2 | | 11/2004 | Suzuki et al. |
| 6,823,124 B1 | | 11/2004 | Renn |
| 6,825,829 B1 | | 11/2004 | Albert |
| 6,827,611 B1 | | 12/2004 | Payne et al. |
| 6,830,460 B1 | | 12/2004 | Rathburn |
| 6,840,777 B2 | | 1/2005 | Sathe et al. |
| 6,853,087 B2 | | 2/2005 | Neuhaus et al. |
| 6,856,151 B1 | | 2/2005 | Cram |
| 6,861,345 B2 | | 3/2005 | Ball et al. |
| 6,910,897 B2 | | 6/2005 | Driscoll et al. |
| 6,946,325 B2 | | 9/2005 | Yean et al. |
| 6,962,829 B2 | | 11/2005 | Glenn et al. |
| 6,965,168 B2 | | 11/2005 | Langhorn |
| 6,967,640 B2 | | 11/2005 | Albert |
| 6,971,902 B2 | | 12/2005 | Taylor |
| 6,987,661 B1 | | 1/2006 | Huemoeller et al. |
| 6,992,376 B2 | | 1/2006 | Jaeck |
| 7,009,413 B1 | | 3/2006 | Alghouli |
| 7,025,600 B2 | | 4/2006 | Higashi |
| 7,029,289 B2 | | 4/2006 | Li |
| 7,040,902 B2 | | 5/2006 | Li |
| 7,045,015 B2 | | 5/2006 | Renn |
| 7,064,412 B2 | | 6/2006 | Geissinger et al. |
| 7,070,419 B2 | | 7/2006 | Brown et al. |

(56) References Cited

U.S. PATENT DOCUMENTS

| | | |
|---|---|---|
| 7,095,090 B2 | 8/2006 | Nakajiman et al. |
| 7,101,210 B2 | 9/2006 | Lin |
| 7,114,960 B2 | 10/2006 | Rathburn |
| 7,118,391 B2 | 10/2006 | Minich et al. |
| 7,121,837 B2 | 10/2006 | Sato et al. |
| 7,121,839 B2 | 10/2006 | Rathburn |
| 7,129,166 B2 | 10/2006 | Speakman |
| 7,138,328 B2 | 11/2006 | Downey et al. |
| 7,145,228 B2 | 12/2006 | Yean et al. |
| 7,148,128 B2 | 12/2006 | Jacobson |
| 7,154,175 B2 | 12/2006 | Shrivastava et al. |
| 7,157,799 B2 | 1/2007 | Noquil et al. |
| 7,180,313 B2 | 2/2007 | Bucksch |
| 7,217,996 B2 | 5/2007 | Cheng et al. |
| 7,220,287 B1 | 5/2007 | Wyrzykowska et al. |
| 7,229,293 B2 | 6/2007 | Sakurai et al. |
| 7,232,263 B2 | 6/2007 | Sashinaka et al. |
| 7,244,967 B2 | 7/2007 | Hundt et al. |
| 7,249,954 B2 | 7/2007 | Weiss |
| 7,276,919 B1 | 10/2007 | Beaman et al. |
| 7,279,911 B2* | 10/2007 | Tunaboylu ......... G01R 1/07378 324/756.03 |
| 7,297,003 B2* | 11/2007 | Rathburn ............... H01R 12/57 439/591 |
| 7,301,105 B2 | 11/2007 | Vasoya |
| 7,321,168 B2 | 1/2008 | Tao |
| 7,326,064 B2 | 2/2008 | Rathburn |
| 7,327,006 B2 | 2/2008 | Svard et al. |
| 7,337,537 B1 | 3/2008 | Smetana, Jr. |
| 7,382,363 B2 | 6/2008 | Albert et al. |
| 7,402,515 B2 | 7/2008 | Arana et al. |
| 7,410,825 B2 | 8/2008 | Majumdar et al. |
| 7,411,304 B2 | 8/2008 | Kirby et al. |
| 7,417,299 B2 | 8/2008 | Hu |
| 7,417,314 B1 | 8/2008 | Lin et al. |
| 7,423,219 B2 | 9/2008 | Kawaguchi et al. |
| 7,427,717 B2 | 9/2008 | Morimoto et al. |
| 7,432,600 B2 | 10/2008 | Klein et al. |
| 7,458,150 B2 | 12/2008 | Totokawa et al. |
| 7,459,393 B2 | 12/2008 | Farnworth et al. |
| 7,485,345 B2 | 2/2009 | Renn |
| 7,489,524 B2 | 2/2009 | Green et al. |
| 7,508,076 B2 | 3/2009 | Japp et al. |
| 7,527,502 B2 | 5/2009 | Li |
| 7,531,906 B2 | 5/2009 | Lee |
| 7,536,714 B2 | 5/2009 | Yuan |
| 7,537,461 B2 | 5/2009 | Rathburn |
| 7,538,415 B1 | 5/2009 | Lin et al. |
| 7,563,645 B2 | 7/2009 | Jaeck |
| 7,595,454 B2 | 9/2009 | Kresge et al. |
| 7,619,309 B2 | 11/2009 | Drexl et al. |
| 7,621,761 B2 | 11/2009 | Mok et al. |
| 7,628,617 B2 | 12/2009 | Brown et al. |
| 7,632,106 B2 | 12/2009 | Nakamura |
| 7,645,635 B2 | 1/2010 | Wood et al. |
| 7,651,382 B2 | 1/2010 | Yasumura et al. |
| 7,658,163 B2 | 2/2010 | Renn |
| 7,674,671 B2 | 3/2010 | Renn |
| 7,726,984 B2 | 6/2010 | Bumb et al. |
| 7,736,152 B2 | 6/2010 | Hougham et al. |
| 7,748,110 B2 | 7/2010 | Asahi et al. |
| 7,758,351 B2 | 7/2010 | Brown et al. |
| 7,800,916 B2 | 9/2010 | Blackwell et al. |
| 7,833,832 B2 | 11/2010 | Wood et al. |
| 7,836,587 B2 | 11/2010 | Kim |
| 7,868,469 B2 | 1/2011 | Mizoguchi |
| 7,874,847 B2 | 1/2011 | Matsui et al. |
| 7,897,503 B2 | 3/2011 | Foster et al. |
| 7,898,087 B2 | 3/2011 | Chainer |
| 7,950,927 B2* | 5/2011 | Kazama ............... G01R 1/0466 324/755.05 |
| 7,955,088 B2* | 6/2011 | Di Stefano ............ H01R 13/24 439/66 |
| 7,999,369 B2 | 8/2011 | Malhan et al. |
| 8,044,502 B2 | 10/2011 | Rathburn |
| 8,058,558 B2 | 11/2011 | Mok et al. |
| 8,072,058 B2 | 12/2011 | Kim et al. |
| 8,114,687 B2 | 2/2012 | Mizoguchi |
| 8,120,173 B2 | 2/2012 | Forman et al. |
| 8,148,643 B2 | 4/2012 | Hirose et al. |
| 8,154,119 B2 | 4/2012 | Yoon et al. |
| 8,158,503 B2 | 4/2012 | Abe |
| 8,159,824 B2 | 4/2012 | Cho et al. |
| 8,178,978 B2 | 5/2012 | McElrea et al. |
| 8,203,207 B2 | 6/2012 | Getz et al. |
| 8,227,703 B2 | 7/2012 | Maruyama et al. |
| 8,232,632 B2 | 7/2012 | Rathburn |
| 8,247,702 B2 | 8/2012 | Kouya |
| 8,278,141 B2 | 10/2012 | Chow et al. |
| 8,299,494 B2 | 10/2012 | Yilmaz et al. |
| 8,329,581 B2 | 12/2012 | Haba et al. |
| 8,344,516 B2 | 1/2013 | Chainer |
| 8,373,428 B2 | 2/2013 | Eldridge et al. |
| 8,421,151 B2 | 4/2013 | Yamashita |
| 8,525,322 B1 | 9/2013 | Kim et al. |
| 8,525,346 B2 | 9/2013 | Rathburn |
| 8,536,714 B2 | 9/2013 | Sakagushi |
| 8,536,889 B2 | 9/2013 | Nelson et al. |
| 8,610,265 B2 | 12/2013 | Rathburn |
| 8,618,649 B2 | 12/2013 | Rathburn |
| 8,758,067 B2 | 6/2014 | Rathburn |
| 8,789,272 B2 | 7/2014 | Rathburn |
| 8,803,539 B2 | 8/2014 | Rathburn |
| 8,829,671 B2 | 9/2014 | Rathburn |
| 8,912,812 B2 | 12/2014 | Rathburn |
| 8,928,344 B2 | 1/2015 | Rathburn |
| 8,955,215 B2 | 2/2015 | Rathburn |
| 8,955,216 B2 | 2/2015 | Rathburn |
| 8,970,031 B2 | 3/2015 | Rathburn |
| 8,981,568 B2 | 3/2015 | Rathburn |
| 8,981,809 B2 | 3/2015 | Rathburn |
| 8,984,748 B2 | 3/2015 | Rathburn |
| 8,987,886 B2 | 3/2015 | Rathburn |
| 8,988,093 B2 | 3/2015 | Rathburn |
| 2001/0012707 A1 | 8/2001 | Ho et al. |
| 2001/0016551 A1 | 8/2001 | Yishio et al. |
| 2002/0011639 A1 | 1/2002 | Carlson et al. |
| 2002/0027441 A1 | 3/2002 | Akrma et al. |
| 2002/0062200 A1 | 5/2002 | Mori et al. |
| 2002/0079912 A1 | 6/2002 | Shahriari et al. |
| 2002/0088116 A1 | 7/2002 | Milkovich et al. |
| 2002/0098740 A1 | 7/2002 | Ooya |
| 2002/0105080 A1 | 8/2002 | Speakman |
| 2002/0105087 A1 | 8/2002 | Forbes et al. |
| 2002/0160103 A1 | 10/2002 | Fukunaga et al. |
| 2003/0003779 A1 | 1/2003 | Rathburn |
| 2003/0096512 A1 | 5/2003 | Cornell |
| 2003/0114029 A1 | 6/2003 | Lee et al. |
| 2003/0117161 A1 | 6/2003 | Burns |
| 2003/0156400 A1 | 8/2003 | Dibene et al. |
| 2003/0162418 A1 | 8/2003 | Yamada |
| 2003/0164548 A1 | 9/2003 | Lee |
| 2003/0188890 A1 | 10/2003 | Bhatt et al. |
| 2003/0189083 A1 | 10/2003 | Olsen |
| 2003/0231819 A1 | 12/2003 | Palmer et al. |
| 2004/0016995 A1 | 1/2004 | Kuo et al. |
| 2004/0029411 A1 | 2/2004 | Rathburn |
| 2004/0048523 A1 | 3/2004 | Huang et al. |
| 2004/0054031 A1 | 3/2004 | Jacobson |
| 2004/0070042 A1 | 4/2004 | Lee et al. |
| 2004/0077190 A1 | 4/2004 | Huang et al. |
| 2004/0174180 A1 | 9/2004 | Fukushima et al. |
| 2004/0183557 A1 | 9/2004 | Akram |
| 2004/0184219 A1 | 9/2004 | Otsuka et al. |
| 2004/0212381 A1* | 10/2004 | Yoshida ............ G01R 1/06722 324/755.02 |
| 2004/0217473 A1 | 11/2004 | Shen |
| 2004/0243348 A1 | 12/2004 | Minatani |
| 2005/0020116 A1 | 1/2005 | Kawazoe et al. |
| 2005/0048680 A1 | 3/2005 | Matsumani |
| 2005/0100294 A1 | 5/2005 | Nguyen et al. |
| 2005/0101164 A1 | 5/2005 | Rathburn |
| 2005/0162176 A1 | 7/2005 | Bucksch |
| 2005/0164527 A1 | 7/2005 | Radza et al. |

(56) References Cited

U.S. PATENT DOCUMENTS

| | | |
|---|---|---|
| 2005/0196511 A1 | 9/2005 | Garrity et al. |
| 2005/0253610 A1 | 11/2005 | Cram |
| 2006/0001152 A1 | 1/2006 | Hu |
| 2006/0006534 A1 | 1/2006 | Yean et al. |
| 2006/0012966 A1 | 1/2006 | Chakravorty |
| 2006/0024924 A1 | 2/2006 | Haji et al. |
| 2006/0044357 A1 | 3/2006 | Andersen |
| 2006/0066331 A1* | 3/2006 | Yoshida ............ G01R 1/06772 324/756.03 |
| 2006/0087064 A1 | 4/2006 | Daniel et al. |
| 2006/0094134 A1* | 5/2006 | Yoshida ............... G01R 1/045 438/14 |
| 2006/0125500 A1 | 6/2006 | Watkins et al. |
| 2006/0145338 A1 | 7/2006 | Dong |
| 2006/0149491 A1 | 7/2006 | Flach et al. |
| 2006/0157103 A1 | 7/2006 | Sheats et al. |
| 2006/0160379 A1 | 7/2006 | Rathburn |
| 2006/0186906 A1 | 8/2006 | Bottoms et al. |
| 2006/0208230 A1 | 9/2006 | Cho et al. |
| 2006/0258912 A1 | 11/2006 | Belson et al. |
| 2006/0261827 A1 | 11/2006 | Cooper et al. |
| 2006/0265919 A1 | 11/2006 | Huang |
| 2006/0281303 A1 | 12/2006 | Trezza et al. |
| 2007/0021002 A1 | 1/2007 | Laurx et al. |
| 2007/0057382 A1 | 3/2007 | Liu et al. |
| 2007/0059901 A1 | 3/2007 | Majumdar et al. |
| 2007/0145981 A1 | 6/2007 | Tomita et al. |
| 2007/0148822 A1 | 6/2007 | Haba et al. |
| 2007/0170595 A1 | 7/2007 | Sinha |
| 2007/0182431 A1 | 8/2007 | Komatsu et al. |
| 2007/0201209 A1 | 8/2007 | Francis et al. |
| 2007/0221404 A1 | 9/2007 | Das et al. |
| 2007/0224735 A1 | 9/2007 | Karashima et al. |
| 2007/0232059 A1 | 10/2007 | Abe |
| 2007/0259539 A1 | 11/2007 | Brown et al. |
| 2007/0267138 A1 | 11/2007 | White et al. |
| 2007/0269999 A1* | 11/2007 | Di Stefano ......... G01R 1/0466 439/73 |
| 2007/0273394 A1 | 11/2007 | Tanner et al. |
| 2007/0287304 A1 | 12/2007 | Eldridge |
| 2007/0289127 A1 | 12/2007 | Hurwitz et al. |
| 2007/0296090 A1 | 12/2007 | Hembree |
| 2008/0008822 A1 | 1/2008 | Kowalski |
| 2008/0020566 A1 | 1/2008 | Egitto et al. |
| 2008/0020624 A1 | 1/2008 | Nikaido et al. |
| 2008/0041822 A1 | 2/2008 | Wang |
| 2008/0057753 A1 | 3/2008 | Rathburn et al. |
| 2008/0060838 A1 | 3/2008 | Chen et al. |
| 2008/0073110 A1 | 3/2008 | Shioga et al. |
| 2008/0088331 A1* | 4/2008 | Yoshida ............... G01R 1/0466 324/755.05 |
| 2008/0093115 A1 | 4/2008 | Lee |
| 2008/0115961 A1 | 5/2008 | Mok et al. |
| 2008/0143358 A1 | 6/2008 | Breinlinger |
| 2008/0143367 A1 | 6/2008 | Chabineau-Lovgren |
| 2008/0156856 A1 | 7/2008 | Barausky et al. |
| 2008/0157361 A1 | 7/2008 | Wood et al. |
| 2008/0185180 A1 | 8/2008 | Cheng et al. |
| 2008/0197867 A1 | 8/2008 | Wokhlu et al. |
| 2008/0220584 A1 | 9/2008 | Kim et al. |
| 2008/0241997 A1 | 10/2008 | Sunohara et al. |
| 2008/0246136 A1 | 10/2008 | Haba et al. |
| 2008/0248596 A1 | 10/2008 | Das et al. |
| 2008/0250363 A1 | 10/2008 | Goto et al. |
| 2008/0265919 A1 | 10/2008 | Izadian |
| 2008/0290885 A1 | 11/2008 | Matsunami |
| 2008/0309349 A1 | 12/2008 | Sutono |
| 2009/0039496 A1 | 2/2009 | Beer et al. |
| 2009/0058444 A1 | 3/2009 | McIntyre |
| 2009/0061089 A1 | 3/2009 | King |
| 2009/0127698 A1 | 5/2009 | Rathburn |
| 2009/0133906 A1 | 5/2009 | Baek |
| 2009/0158581 A1 | 6/2009 | Nguyen et al. |
| 2009/0180236 A1 | 7/2009 | Lee et al. |
| 2009/0224404 A1 | 9/2009 | Wood et al. |
| 2009/0241332 A1* | 10/2009 | Lauffer ................ H05K 3/462 29/829 |
| 2009/0267628 A1 | 10/2009 | Takase |
| 2009/0321915 A1 | 12/2009 | Hu et al. |
| 2010/0133680 A1 | 6/2010 | Kang et al. |
| 2010/0143194 A1 | 6/2010 | Lee et al. |
| 2010/0188112 A1* | 7/2010 | Yoshida ................ G01R 1/045 324/755.01 |
| 2010/0213960 A1 | 8/2010 | Mok et al. |
| 2010/0244872 A1* | 9/2010 | Yoshida ................ G01R 1/045 324/754.03 |
| 2010/0300734 A1 | 12/2010 | Ables et al. |
| 2011/0083881 A1 | 4/2011 | Nguyen et al. |
| 2011/0101540 A1 | 5/2011 | Chainer |
| 2012/0017437 A1 | 1/2012 | Das et al. |
| 2012/0043119 A1 | 2/2012 | Rathburn |
| 2012/0043130 A1 | 2/2012 | Rathburn |
| 2012/0043667 A1 | 2/2012 | Rathburn |
| 2012/0044659 A1 | 2/2012 | Rathburn |
| 2012/0049342 A1 | 3/2012 | Rathburn |
| 2012/0049877 A1 | 3/2012 | Rathburn |
| 2012/0051016 A1 | 3/2012 | Rathburn |
| 2012/0055701 A1 | 3/2012 | Rathburn |
| 2012/0055702 A1 | 3/2012 | Rathburn |
| 2012/0056332 A1 | 3/2012 | Rathburn |
| 2012/0056640 A1 | 3/2012 | Rathburn |
| 2012/0058653 A1 | 3/2012 | Rathburn |
| 2012/0061846 A1 | 3/2012 | Rathburn |
| 2012/0061851 A1 | 3/2012 | Rathburn |
| 2012/0062270 A1 | 3/2012 | Rathburn |
| 2012/0068727 A1 | 3/2012 | Rathburn |
| 2012/0161317 A1 | 6/2012 | Rathburn |
| 2012/0164888 A1 | 6/2012 | Rathburn |
| 2012/0168948 A1 | 7/2012 | Rathburn |
| 2012/0171907 A1* | 7/2012 | Rathburn .............. H01R 12/52 439/700 |
| 2012/0182035 A1 | 7/2012 | Rathburn |
| 2012/0199985 A1 | 8/2012 | Rathburn |
| 2012/0202364 A1 | 8/2012 | Rathburn |
| 2012/0244728 A1 | 9/2012 | Rathburn |
| 2012/0252164 A1 | 10/2012 | Nakao et al. |
| 2012/0257343 A1 | 10/2012 | Das et al. |
| 2012/0268155 A1 | 10/2012 | Rathburn |
| 2013/0078860 A1* | 3/2013 | Rathburn ............ H01R 12/7082 439/620.01 |
| 2013/0105984 A1 | 5/2013 | Rathburn |
| 2013/0203273 A1 | 8/2013 | Rathburn |
| 2013/0206468 A1* | 8/2013 | Rathburn ............ H01R 43/0256 174/263 |
| 2013/0210276 A1* | 8/2013 | Rathburn ................ H01R 11/16 439/620.22 |
| 2013/0223034 A1 | 8/2013 | Rathburn |
| 2013/0244490 A1 | 9/2013 | Rathburn |
| 2013/0330942 A1 | 12/2013 | Rathburn |
| 2014/0043782 A1 | 2/2014 | Rathburn |
| 2014/0080258 A1 | 3/2014 | Rathburn |
| 2014/0192498 A1* | 7/2014 | Rathburn ............ H01L 23/49822 361/767 |
| 2014/0220797 A1* | 8/2014 | Rathburn ................ H01R 43/18 439/65 |
| 2014/0225255 A1* | 8/2014 | Rathburn .............. H05K 3/4644 257/737 |
| 2014/0242816 A1* | 8/2014 | Rathburn ................ H01R 12/52 439/68 |
| 2015/0013901 A1 | 1/2015 | Rathburn |
| 2015/0091600 A1* | 4/2015 | Rathburn ............ G01R 1/0466 324/756.02 |
| 2015/0136467 A1 | 5/2015 | Rathburn |
| 2015/0162678 A1 | 6/2015 | Rathburn |
| 2015/0181710 A1 | 6/2015 | Rathburn |

FOREIGN PATENT DOCUMENTS

| | | |
|---|---|---|
| WO | WO 2006/039277 | 4/2006 |
| WO | WO 2006/124597 | 11/2006 |
| WO | WO 2008/156856 | 12/2008 |
| WO | WO 2010/138493 | 12/2010 |
| WO | WO 2010/141264 | 12/2010 |

(56) References Cited

FOREIGN PATENT DOCUMENTS

| | | |
|---|---|---|
| WO | WO 2010/141266 | 12/2010 |
| WO | WO 2010/141295 | 12/2010 |
| WO | WO 2010/141296 | 12/2010 |
| WO | WO 2010/141297 | 12/2010 |
| WO | WO 2010/141298 | 12/2010 |
| WO | WO 2010/141303 | 12/2010 |
| WO | WO 2010/141311 | 12/2010 |
| WO | WO 2010/141313 | 12/2010 |
| WO | WO 2010/141316 | 12/2010 |
| WO | WO 2010/141318 | 12/2010 |
| WO | WO 2010/147782 | 12/2010 |
| WO | WO 2010/147934 | 12/2010 |
| WO | WO 2010/147939 | 12/2010 |
| WO | WO 2011/002709 | 1/2011 |
| WO | WO 2011/002712 | 1/2011 |
| WO | WO 2011/097160 | 8/2011 |
| WO | WO 2011/139619 | 11/2011 |
| WO | WO 2011/153298 | 12/2011 |
| WO | WO 2012/061008 | 5/2012 |
| WO | WO 2012/074963 | 6/2012 |
| WO | WO 2012/074969 | 6/2012 |
| WO | WO 2012/078493 | 6/2012 |
| WO | WO 2012/122142 | 9/2012 |
| WO | WO 2012/125331 | 9/2012 |
| WO | WO 2013/036565 | 3/2013 |
| WO | WO 2014/011226 | 1/2014 |
| WO | WO 2014/011228 | 1/2014 |
| WO | WO 2014/011232 | 1/2014 |
| WO | WO-2015/006393 | 1/2015 |

OTHER PUBLICATIONS

Notification of Transmittal of the International Search Report and the Written Opinion of the International Searching Authority mailed Jul. 21, 2010 in International Application No. PCT/US2010/036047.

Notification of Transmittal of the International Search Report and the Written Opinion of the International Searching Authority mailed Jul. 28, 2010 in International Application No. PCT/US2010/036363.

Notification of Transmittal of the International Search Report and the Written Opinion of the International Searching Authority mailed Jul. 28, 2010 in International Application No. PCT/US2010/036377.

Notification of Transmittal of the International Search Report and the Written Opinion of the International Searching Authority mailed Jul. 30, 2010 in International Application No. PCT/US2010/036388.

Notification of Transmittal of the International Search Report and the Written Opinion of the International Searching Authority mailed Jul. 27, 2010 in International Application No. PCT/US2010/036397.

Notification of Transmittal of the International Search Report and the Written Opinion of the International Searching Authority mailed Jul. 30, 2010 in International Application No. PCT/US2010/036055.

Notification of Transmittal of the International Search Report and the Written Opinion of the International Searching Authority mailed Aug. 4, 2010 in International Application No. PCT/US2010/036288.

Notification of Transmittal of the International Search Report and the Written Opinion of the International Searching Authority mailed Aug. 4, 2010 in International Application No. PCT/US2010/036285.

Notification of Transmittal of the International Search Report and the Written Opinion of the International Searching Authority mailed Jul. 30, 2010 in International Application No. PCT/US2010/036282.

Notification of Transmittal of the International Search Report and the Written Opinion of the International Searching Authority mailed Jul. 30, 2010 in International Application No. PCT/US2010/036295.

Notification of Transmittal of the International Search Report and the Written Opinion of the International Searching Authority mailed Jul. 30, 2010 in International Application No. PCT/US2010/036313.

Notification of Transmittal of the International Search Report and the Written Opinion of the International Searching Authority mailed Aug. 3, 2010 in International Application No. PCT/US2010/037619.

Notification of Transmittal of the International Search Report and the Written Opinion of the International Searching Authority mailed Sep. 7, 2010 in International Application No. PCT/US2010/038600.

Notification of Transmittal of the International Search Report and the Written Opinion of the International Searching Authority mailed Aug. 18, 2010 in International Application No. PCT/US2010/038606.

Notification of Transmittal of the International Search Report and the Written Opinion of the International Searching Authority mailed Sep. 1, 2010 in International Application No. PCT/US2010/040188.

Notification of Transmittal of the International Search Report and the Written Opinion of the International Searching Authority mailed Aug. 20, 2010 in International Application No. PCT/US2010/040197.

Notification of Transmittal of the International Search Report and the Written Opinion of the International Searching Authority mailed Apr. 14, 2011 in International Application No. PCT/US2011/023138.

Notification of Transmittal of the International Search Report and the Written Opinion of the International Searching Authority mailed Aug. 17, 2011 in International Application No. PCT/US2011/033726.

Notification of Transmittal of the International Search Report and the Written Opinion of the International Searching Authority mailed Sep. 27, 2011 in International Application No. PCT/US2011/038845.

Notification of Transmittal of the International Search Report and the Written Opinion of the International Searching Authority mailed Feb. 8, 2012 in International Application No. PCT/US2011/056664.

Notification of Transmittal of the International Search Report and the Written Opinion of the International Searching Authority mailed Mar. 26, 2012 in International Application No. PCT/US2011/062313.

Notification of Transmittal of the International Search Report and the Written Opinion of the International Searching Authority mailed Jun. 20, 2012 in International Application No. PCT/US2012/027813.

Notification of Transmittal of the International Search Report and the Written Opinion of the International Searching Authority mailed Jun. 19, 2012 in International Application No. PCT/US2012/027823.

Notification of Transmittal of the International Search Report and the Written Opinion of the International Searching Authority mailed Nov. 29, 2012 in International Application No. PCT/US2012/053848.

Notification of Transmittal of the International Search Report and the Written Opinion of the International Searching Authority mailed Jun. 3, 2013 in International Application No. PCT/US2013/031395.

Notification of Transmittal of the International Search Report and the Written Opinion of the International Searching Authority mailed Jun. 19, 2013 in International Application No. PCT/US2013/030981.

Notification of Transmittal of the International Search Report and the Written Opinion of the International Searching Authority mailed Jun. 7, 2013 in International Application No. PCT/US2013/030856.

Notification of Transmittal of the International Search Report and the Written Opinion of the International Searching Authority mailed Oct. 27, 2014 in International Application No. PCT/US2014/045856.

Tarzwell, Robert, "A Real Printed Electronic Replacement for PCB Fabrication," PCB007 Magazine, May 19, 2009.

Tarzwell, Robert, "Green PCB Manufacturing Announced," Electrical Engineering Times, May 18, 2009.

Tarzwell, Robert, "Can Printed Electronics Replace PCB Technology?" PCB007 Magazine, May 14, 2009.

(56) References Cited

OTHER PUBLICATIONS

Tarzwell, Robert, "The Bleeding Edge: Printed Electronics, Inkjets and Silver Ink," PCB007 Magazine, May 6, 2009.
Tarzwell, Robert, "Integrating Printed Electronics and PCB Technologies," Printed Electronics World, Jul. 14, 2009.
Tarzwell, Robert, "Printed Electronics: The Next Generation of PCBs?" PCB007 Magazine, Apr. 28, 2009.
Liu, et al, "All-Polymer Capacitor Fabricated with Inkjet Printing Technique," Solid-State Electronics, vol. 47, pp. 1543-1548 (2003).
Print—Definition of Print by The Free Dictionary, http://www.thefreedictionary.com/print, Aug. 13, 2014.
Restriction Requirement mailed Jun. 13, 2013 in co-pending U.S. Appl. No. 13/266,486, now published as US Patent Application Publication No. US 2012/0055701.
Response to Restriction Requirement filed Jul. 15, 2013 in co-pending U.S. Appl. No. 13/266,486, now published as US Patent Application Publication No. US 2012/0055701.
Restriction Requirement mailed Sep. 25, 2013 in co-pending U.S. Appl. No. 13/266,486, now published as US Patent Application Publication No. US 2012/0055701.
Response to Restriction Requirement filed Oct. 2, 2013 in co-pending U.S. Appl. No. 13/266,486, now published as US Patent Application Publication No. US 2012/0055701.
Office Action mailed Oct. 30, 2013 in co-pending U.S. Appl. No. 13/266,486, now published as US Patent Application Publication No. US 2012/0055701.
Amendment and Response filed Nov. 6, 2013 in co-pending U.S. Appl. No. 13/266,486, now published as US Patent Application Publication No. US 2012/0055701.
Notice of Non-Compliant Amended mailed Nov. 15, 2013 in co-pending U.S. Appl. No. 13/266,486, now published as US Patent Application Publication No. US 2012/0055701.
Response and Examiner's Interview Summary filed Nov. 20, 2013 in co-pending U.S. Appl. No. 13/266,486, now published as US Patent Application Publication No. US 2012/0055701.
Final Office Action mailed May 15, 2014 in co-pending U.S. Appl. No. 13/266,486, now published as US Patent Application Publication No. US 2012/0055701.
Amendment and Response Under Rule 1.116 filed Jul. 10, 2014 in co-pending U.S. Appl. No. 13/266,486, now published as US Patent Application Publication No. US 2012/0055701.
Advisory Action mailed Jul. 21, 2014 in co-pending U.S. Appl. No. 13/266,486, now published as US Patent Application Publication No. US 2012/0055701.
Request for Continued Examination filed Jul. 31, 2014 in co-pending U.S. Appl. No. 13/266,486, now published as US Patent Application Publication No. US 2012/0055701.
*Ex Parte Quayle* Action mailed Oct. 1, 2014 in co-pending U.S. Appl. No. 13/266,486, now published as US Patent Application Publication No. US 2012/0055701.
Amendment and Response After *ExParte Quayle* Action filed Oct. 6, 2014 in co-pending U.S. Appl. No. 13/266,486, now published as US Patent Application Publication No. US 2012/0055701.
Notice of Non-Compliant Amendment mailed Oct. 14, 2014 in co-pending U.S. Appl. No. 13/266,486, now published as US Patent Application Publication No. US 2012/0055701.
Corrected Amendment and Response filed Oct. 15, 2014 in co-pending U.S. Appl. No. 13/266,486, now published as US Patent Application Publication No. US 2012/0055701.
Notice of Allowance and Fee(s) Due mailed Nov. 24, 2014 in co-pending U.S. Appl. No. 13/266,486, now published as US Patent Application Publication No. US 2012/0055701.
Supplemental Notice of Allowance mailed Dec. 24, 2014 in co-pending U.S. Appl. No. 13/266,486, now published as US Patent Application Publication No. US 2012/0055701.
Notice of Allowance and Fee(s) Due mailed May 2, 2014 in co-pending U.S. Appl. No. 13/266,522, now issued as U.S. Pat. No. 8,803,539.
Restriction Requirement mailed Oct. 1, 2013 in co-pending U.S. Appl. No. 13/319,145, now published as US Patent Application Publication No. 2012/0049342.
Response to Restriction Requirement filed Oct. 4, 2013 in co-pending U.S. Appl. No. 13/319,145, now published as US Patent Application Publication No. 2012/0049342.
Office Action mailed Dec. 26, 2013 in co-pending U.S. Appl. No. 13/319,145, now published as US Patent Application Publication No. 2012/0049342.
Amendment and Response filed Mar. 18, 2014 in co-pending U.S. Appl. No. 13/319,145, now published as US Patent Application Publication No. 2012/0049342.
Final Office Action mailed Aug. 4, 2014 in co-pending U.S. Appl. No. 13/319,145, now published as US Patent Application Publication No. 2012/0049342.
Applicant-Initiated Interview Summary mailed Sep. 12, 2014 in co-pending U.S. Appl. No. 13/319,145 now published as US Patent Application Publication No. US 2012/0049342.
Amendment and Response Under Rule 1.116 filed Sep. 18, 2014 in co-pending U.S. Appl. No. 13/319,145 now published as US Patent Application Publication No. US 2012/0049342.
Notice of Allowance and Fee(s) Due mailed Dec. 19, 2014 in co-pending U.S. Appl. No. 13/319,145 now published as US Patent Application Publication No. US 2012/0049342.
Office Action mailed Nov. 22, 2013 in co-pending U.S. Appl. No. 13/266,907, now issued as U.S. Pat. No. 8,928,344.
Amendment and Response filed Jan. 3, 2014 in co-pending U.S. Appl. No. 13/266,907, now issued as U.S. Pat. No. 8,928,344.
Supplemental Amendment and Response filed Jan. 29, 2014 in co-pending U.S. Appl. No. 13/266,907, now issued as U.S. Pat. No. 8,928,344.
Final Office Action mailed May 7, 2014 in co-pending U.S. Appl. No. 13/266,907, now issued as U.S. Pat. No. 8,928,344.
Amendment and Response Under Rule 1.116 mailed Jul. 10, 2014 in co-pending U.S. Appl. No. 13/266,907, now issued as U.S. Pat. No. 8,928,344.
Advisory Action mailed Jul. 25, 2014 in co-pending U.S. Appl. No. 13/266,907, now issued as U.S. Pat. No. 8,928,344.
Advisory Action mailed Aug. 8, 2014 in co-pending U.S. Appl. No. 13/266,907, now issued as U.S. Pat. No. 8,928,344.
Amendment and Response to Final Office Action and RCE filed Aug. 26, 2014 in co-pending U.S. Appl. No. 13/266,907, now issued as U.S. Pat. No. 8,928,344.
Notice of Allowance and Fee(s) Due mailed Oct. 8, 2014 in co-pending U.S. Appl. No. 13/266,907, now issued as U.S. Pat. No. 8,928,344.
Office Action mailed Jan. 3, 2014 in co-pending U.S. Appl. No. 13/318,038, now issued as U.S. Pat. No. 8,912,812.
Amendment and Response and Terminal Disclaimer filed Apr. 2, 2014 in co-pending U.S. Appl. No. 13/318,038, now issued as U.S. Pat. No. 8,912,812.
Terminal Disclaimer Review Decision mailed Apr. 2, 2014 in co-pending U.S. Appl. No. 13/318,038, now issued as U.S. Pat. No. 8,912,812.
Final Office Action mailed Aug. 1, 2014 in co-pending U.S. Appl. No. 13/318,038, now issued as U.S. Pat. No. 8,912,812.
Amendment and Response Under Rule 1.116 and Termination Disclaimer filed Sep. 4, 2014 in co-pending U.S. Appl. No. 13/318,038, now issued as U.S. Pat. No. 8,912,812.
Terminal Disclaimer Review Decision mailed Sep. 8, 2014 in co-pending U.S. Appl. No. 13/318,038, now issued as U.S. Pat. No. 8,912,812.
Notice of Allowance and Fee(s) Due mailed Sep. 30, 2014 in co-pending U.S. Appl. No. 13/318,038, now issued as U.S. Pat. No. 8,912,812.
Restriction Requirement mailed Dec. 9, 2013 in co-pending U.S. Appl. No. 13/318,171, now issued as U.S. Pat. No. 8,789,272.
Response to Restriction Requirement filed Dec. 17, 2013 in co-pending U.S. Appl. No. 13/318,171, now issued as U.S. Pat. No. 8,789,272.
Office Action mailed Feb. 14, 2014 in co-pending U.S. Appl. No. 13/318,171, now issued as U.S. Pat. No. 8,789,272.

(56) References Cited

OTHER PUBLICATIONS

Amendment and Response filed Feb. 26, 2014 in co-pending U.S. Appl. No. 13/318,171, now issued as U.S. Pat. No. 8,789,272.
Notice of Allowance and Fee(s) Due mailed Mar. 14, 2014 in co-pending U.S. Appl. No. 13/318,171, now issued as U.S. Pat. No. 8,789,272.
Restriction Requirement mailed Dec. 9, 2013 in co-pending U.S. Appl. No. 13/318,181, now published as US Patent Application Publication No. US 2012/0044659.
Response to Restriction Requirement filed Jan. 28, 2014 in co-pending U.S. Appl. No. 13/318,181, now published as US Patent Application Publication No. US 2012/0044659.
Office Action mailed Apr. 21, 2014 in co-pending U.S. Appl. No. 13/318,181, now published as US Patent Application Publication No. US 2012/0044659.
Amendment and Response filed Jul. 27, 2014 in co-pending U.S. Appl. No. 13/318,181, now published as US Patent Application Publication No. US 2012/0044659.
Notice of Allowance and Fee(s) Due mailed Oct. 24, 2014 in co-pending U.S. Appl. No. 13/318,181, now published as US Patent Application Publication No. US 2012/0044659.
Supplemental Notice of Allowance mailed Dec. 19, 2014 in co-pending U.S. Appl. No. 13/318,181, now published as US Patent Application Publication No. US 2012/0044659.
Restriction Requirement mailed Mar. 1, 2013 in co-pending U.S. Appl. No. 13/318,200, now published as US Patent Application Publication No. US 2012/0056332.
Response to Restriction Requirement filed Mar. 7, 2013 in co-pending U.S. Appl. No. 13/318,200, now published as US Patent Application Publication No. US 2012/0056332.
Office Communication mailed May 30, 2013 in co-pending U.S. Appl. No. 13/318,200, now published as US Patent Application Publication No. US 2012/0056332.
Office Action mailed May 30, 2013 in co-pending U.S. Appl. No. 13/318,200, now published as US Patent Application Publication No. US 2012/0056332.
Amendment and Response filed Jul. 1, 2013 in co-pending U.S. Appl. No. 13/318,200, now published as US Patent Application Publication No. US 2012/0056332.
Final Office Action mailed Nov. 6, 2013 in co-pending U.S. Appl. No. 13/318,200, now published as US Patent Application Publication No. US 2012/0056332.
Amendment and Response to Final Office Action filed Nov. 26, 2013 in co-pending U.S. Appl. No. 13/318,200, now published as US Patent Application Publication No. US 2012/0056332.
Advisory Action mailed Dec. 6, 2013 in co-pending U.S. Appl. No. 13/318,200, now published as US Patent Application Publication No. US 2012/0056332.
Response to Advisory Action filed Dec. 6, 2013 in co-pending U.S. Appl. No. 13/318,200, now published as US Patent Application Publication No. US 2012/0056332.
Request for Continued Examination filed Feb. 11, 2014 in co-pending U.S. Appl. No. 13/318,200, now published as US Patent Application Publication No. US 2012/0056332.
Office Action mailed Nov. 19, 2014 in co-pending U.S. Appl. No. 13/318,200, now published as US Patent Application Publication No. US 2012/0056332.
Office Action mailed Nov. 23, 2012 in co-pending U.S. Appl. No. 13/318,263, now published as US Patent Application Publication No. US 2012/0043667.
Amendment and Response filed Mar. 4, 2013 in co-pending U.S. Appl. No. 13/318,263, now published as US Patent Application Publication No. US 2012/0043667.
Office Action mailed Jul. 10, 2013 in co-pending U.S. Appl. No. 13/318,263, now published as US Patent Application Publication No. US 2012/0043667.
Amendment and Response filed Sep. 24, 2013 in co-pending U.S. Appl. No. 13/318,263, now published as US Patent Application Publication No. US 2012/0043667.
Notice of Allowance mailed Oct. 28, 2013 in co-pending U.S. Appl. No. 13/318,263, now published as US Patent Application Publication No. US 2012/0043667.
Office Action mailed Sep. 10, 2013 in co-pending U.S. Appl. No. 13/320,285, now published as US Patent Application Publication No. US 2012/0055702.
Amendment and Response filed Oct. 2, 2013 in co-pending U.S. Appl. No. 13/320,285, now published as US Patent Application Publication No. US 2012/0055702.
Final Office Action mailed Jan. 8, 2014 in co-pending U.S. Appl. No. 13/320,285, now published as US Patent Application Publication No. US 2012/0055702.
Amendment and Response to Final Office filed Feb. 18, 2014 in co-pending U.S. Appl. No. 13/320,285, now published as US Patent Application Publication No. US 2012/0055702.
Advisory Action mailed Feb. 26, 2014 in co-pending U.S. Appl. No. 13/320,285, now published as US Patent Application Publication No. US 2012/0055702.
RCE filed Mar. 10, 2014 in co-pending U.S. Appl. No. 13/320,285, now published as US Patent Application Publication No. US 2012/0055702.
Office Action mailed Jul. 29, 2014 in co-pending U.S. Appl. No. 13/320,285, now published as US Patent Application Publication No. US 2012/0055702.
Amendment and Response and Examiner's Interview Summary filed Oct. 15, 2014 in co-pending U.S. Appl. No. 13/320,285, now published as US Patent Application Publication No. US 2012/0055702.
Restriction Requirement mailed Sep. 8, 2014 in co-pending U.S. Appl. No. 13/318,369, now published as US Patent Application Publication No. US 2012/0043119.
Response to Restriction Requirement filed Oct. 13, 2014 in co-pending U.S. Appl. No. 13/318,369, now published as US Patent Application Publication No. US 2012/0043119.
Office Action mailed Nov. 14, 2014 in co-pending U.S. Appl. No. 13/318,369, now published as US Patent Application Publication No. US 2012/0043119.
Office Action mailed Aug. 26, 2014 in co-pending U.S. Appl. No. 13/318,382, now published as US Patent Application Publication No. US 2012/0043130.
Amendment and Response and Terminal Disclaimer filed Nov. 14, 2014 in co-pending U.S. Appl. No. 13/318,382, now published as US Patent Application Publication No. US 2012/0043130.
Restriction Requirement mailed Sep. 26, 2013 in co-pending U.S. Appl. No. 13/319,120 now published as US Patent Application Publication No. US 2012/0061851.
Response to Restriction Requirement filed Oct. 8, 2013 in co-pending U.S. Appl. No. 13/319,120 now published as US Patent Application Publication No. US 2012/0061851.
Notice of Non-Compliant Amendment mailed Oct. 15, 2013 in co-pending U.S. Appl. No. 13/319,120 now published as US Patent Application Publication No. US 2012/0061851.
Response to Restriction Requirement filed Oct. 18, 2013 in co-pending U.S. Appl. No. 13/319,120 now published as US Patent Application Publication No. US 2012/0061851.
Office Action mailed Jan. 17, 2014 in co-pending U.S. Appl. No. 13/319,120 now published as US Patent Application Publication No. US 2012/0061851.
Amendment and Response filed Apr. 16, 2014 in co-pending U.S. Appl. No. 13/319,120 now published as US Patent Application Publication No. US 2012/0061851.
Final Office Action mailed Jul. 31, 2014 in co-pending U.S. Appl. No. 13/319,120 now published as US Patent Application Publication No. US 2012/0061851.
Applicant-Initiated Interview Summary mailed Sep. 12, 2014 in co-pending U.S. Appl. No. 13/319,120 now published as US Patent Application Publication No. US 2012/0061851.
Amendment and Response and RCE filed Oct. 1, 2014 in co-pending U.S. Appl. No. 13/319,120 now published as US Patent Application Publication No. US 2012/0061851.
Notice of Allowance and Fee(s) Due mailed Oct. 27, 2014 in co-pending U.S. Appl. No. 13/319,120 now published as US Patent Application Publication No. US 2012/0061851.

(56) References Cited

OTHER PUBLICATIONS

Restriction Requirement mailed Jan. 30, 2014 in co-pending U.S. Appl. No. 13/319,158, now published as US Patent Application Publication No. 2012/0051016.
Response to Restriction Requirement filed Feb. 6, 2014 in co-pending U.S. Appl. No. 13/319,158, now published as US Patent Application Publication No. 2012/0051016.
Office Action mailed Jun. 27, 2014 in co-pending U.S. Appl. No. 13/319,158, now published as US Patent Application Publication No. 2012/0051016.
Amendment and Response filed Sep. 3, 2014 in co-pending U.S. Appl. No. 13/319,158, now published as US Patent Application Publication No. 2012/0051016.
Final Office Action mailed Nov. 6, 2014 in co-pending U.S. Appl. No. 13/319,158, now published as US Patent Application Publication No. 2012/0051016.
Amendment and Response Under Rule 1.116 and Request After Final Consideration Program 2.0 filed Dec. 18, 2014 in co-pending U.S. Appl. No. 13/319,158, now published as US Patent Application Publication No. 2012/0051016.
Advisory Action mailed Jan. 2, 2015 in co-pending U.S. Appl. No. 13/319,158, now published as US Patent Application Publication No. 2012/0051016.
Office Action mailed Feb. 27, 2014 in co-pending U.S. Appl. No. 13/319,203, now published as US Patent Application Publication No. 2012/0056640.
Amendment and Response filed Jun. 10, 2014 in co-pending U.S. Appl. No. 13/319,203, now published as US Patent Application Publication No. 2012/0056640.
Final Office Action mailed Aug. 20, 2014 in co-pending U.S. Appl. No. 13/319,203, now published as US Patent Application Publication No. 2012/0056640.
Amendment and Response Under Rule 1.116 filed Oct. 2, 2014 in co-pending U.S. Appl. No. 13/319,203, now published as US Patent Application Publication No. 2012/0056640.
Applicant-Initiated Interview Summary mailed Oct. 9, 2014 in co-pending U.S. Appl. No. 13/319,203, now published as US Patent Application Publication No. 2012/0056640.
Advisory Action mailed Oct. 16, 2014 in co-pending U.S. Appl. No. 13/319,203, now published as US Patent Application Publication No. 2012/0056640.
Request for Continued Examination filed Nov. 12, 2014 in co-pending U.S. Appl. No. 13/319,203, now published as US Patent Application Publication No. 2012/0056640.
Notice of Allowance and Fee(s) Due mailed Dec. 10, 2014 in co-pending U.S. Appl. No. 13/319,203, now published as US Patent Application Publication No. 2012/0056640.
Response to Restriction Requirement filed Oct. 4, 2013 in co-pending U.S. Appl. No. 13/266,573, now published as US Patent Application Publication No. 2012/0061846.
Office Action mailed Feb. 21, 2014 in co-pending U.S. Appl. No. 13/266,573, now published as US Patent Application Publication No. 2012/0061846.
Amendment and Response filed Feb. 26, 2014 in co-pending U.S. Appl. No. 13/266,573, now published as US Patent Application Publication No. 2012/0061846.
Office Action mailed Jul. 3, 2014 in co-pending U.S. Appl. No. 13/266,573, now published as US Patent Application Publication No. 2012/0061846.
Amendment and Response filed Sep. 9, 2014 in co-pending U.S. Appl. No. 13/266,573, now published as US Patent Application Publication No. 2012/0061846.
Examiner-Initiated Interview Summary mailed Mar. 14, 2013 in co-pending U.S. Appl. No. 13/319,228, now published as US Patent Application Publication No. US 2012/0058653.
Restriction Requirement mailed Apr. 23, 2014 in co-pending U.S. Appl. No. 13/319,228, now published as US Patent Application Publication No. US 2012/0058653.
Response to Restriction Requirement filed Jun. 23, 2014 in co-pending U.S. Appl. No. 13/319,228, now published as US Patent Application Publication No. US 2012/0058653.
Office Action mailed Sep. 4, 2014 in co-pending U.S. Appl. No. 13/319,228, now published as US Patent Application Publication No. US 2012/0058653.
Amendment and Response and Terminal Disclaimer filed Nov. 17, 2014 in co-pending U.S. Appl. No. 13/319,228, now published as US Patent Application Publication No. US 2012/0058653.
Notice of Allowance and Fee(s) Due mailed Jan. 13, 2015 in co-pending U.S. Appl. No. 13/319,228, now published as US Patent Application Publication No. US 2012/0058653.
Restriction Requirement mailed Feb. 7, 2014 in co-pending U.S. Appl. No. 13/575,368, now published as US Patent Application Publication No. 2013/0203273.
Response to Restriction Requirement filed Feb. 19, 2014 in co-pending U.S. Appl. No. 13/575,368, now published as US Patent Application Publication No. 2013/0203273.
Office Action mailed Mar. 4, 2014 in co-pending U.S. Appl. No. 13/575,368, now published as US Patent Application Publication No. 2013/0203273.
Notice of Abandonment mailed Oct. 10, 2014 in co-pending U.S. Appl. No. 13/575,368, now published as US Patent Application Publication No. 2013/0203273.
Office Action mailed Sep. 17, 2014 in co-pending U.S. Appl. No. 13/643,436, now published as US Patent Application Publication No. 2013/0105984.
Amendment and Response filed Nov. 19, 2014 in co-pending U.S. Appl. No. 13/643,436, now published as US Patent Application Publication No. 2013/0105984.
Office Action mailed Apr. 24, 2014 in co-pending U.S. Appl. No. 13/700,639, now published as US Patent Application Publication No. 2013/0078860.
Amendment and Response filed Jul. 30, 2014 in co-pending U.S. Appl. No. 13/700,639, now published as US Patent Application Publication No. 2013/0078860.
Final Office Action mailed Sep. 8, 2014 in co-pending U.S. Appl. No. 13/700,639, now published as US Patent Application Publication No. 2013/0078860.
Response Under Rule 1.116 filed Nov. 11, 2014 in co-pending U.S. Appl. No. 13/700,639, now published as US Patent Application Publication No. 2013/0078860.
Advisory Action mailed Dec. 3, 2014 in co-pending U.S. Appl. No. 13/700,639, now published as US Patent Application Publication No. 2013/0078860.
Amendment and Response and RCE filed Dec. 30, 2014 in co-pending U.S. Appl. No. 13/700,639, now published as US Patent Application Publication No. 2013/0078860.
Restriction Requirement mailed Jun. 5, 2014 in co-pending U.S. Appl. No. 13/879,783, now published as US Patent Application Publication No. 2013/0223034.
Response to Restriction Requirement filed Jul. 17, 2014 in co-pending U.S. Appl. No. 13/879,783, now published as US Patent Application Publication No. 2013/0223034.
Office Action mailed Oct. 6, 2014 in co-pending U.S. Appl. No. 13/879,783, now published as US Patent Application Publication No. 2013/0223034.
Office Action mailed Nov. 17, 2014 in co-pending U.S. Appl. No. 13/879,883, now published as US Patent Application Publication No. 2013/0244490.
Restriction Requirement mailed Sep. 9, 2013 in co-pending U.S. Appl. No. 13/410,914, now published as US Patent Application Publication No. US 2012/0164888.
Response to Restriction Requirement and Amendment to the Claims filed Sep. 25, 2013 in co-pending U.S. Appl. No. 13/410,914, now published as US Patent Application Publication No. US 2012/0164888.
Office Action mailed Dec. 16, 2013 in co-pending U.S. Appl. No. 13/410,914, now published as US Patent Application Publication No. US 2012/0164888.
Amendment and Response filed Mar. 17, 2014 in co-pending U.S. Appl. No. 13/410,914, now published as US Patent Application Publication No. US 2012/0164888.

(56) References Cited

OTHER PUBLICATIONS

Final Office Action mailed Jun. 4, 2014 in co-pending U.S. Appl. No. 13/410,914, now published as US Patent Application Publication No. US 2012/0164888.
Amendment and Response Under Rule 1.116 filed Jul. 29, 2014 in co-pending U.S. Appl. No. 13/410,914, now published as US Patent Application Publication No. US 2012/0164888.
Advisory Action mailed Aug. 12, 2014 in co-pending U.S. Appl. No. 13/410,914, now published as US Patent Application Publication No. US 2012/0164888.
Amendment and Response and RCE filed Sep. 30, 2014 in co-pending U.S. Appl. No. 13/410,914, now published as US Patent Application Publication No. US 2012/0164888.
Office Action mailed Dec. 26, 2014 in co-pending U.S. Appl. No. 13/410,914, now published as US Patent Application Publication No. US 2012/0164888.
Restriction Requirement mailed Jul. 31, 2014 in co-pending U.S. Appl. No. 13/410,943, now published as US Patent Application Publication No. US 2012/0161317.
Response to Restriction Requirement filed Aug. 19, 2014 in co-pending U.S. Appl. No. 13/410,943, now published as US Patent Application Publication No. US 2012/0161317.
Office Action mailed Nov. 7, 2013 in co-pending U.S. Appl. No. 13/412,870, now published as US Patent Application Publication No. US 2012/0171907.
Amendment and Response filed Dec. 10, 2013 in co-pending U.S. Appl. No. 13/412,870, now published as US Patent Application Publication No. US 2012/0171907.
Notice of Allowance and Fee(s) Due mailed Feb. 26, 2014 in co-pending U.S. Appl. No. 13/412,870, now published as US Patent Application Publication No. US 2012/0171907.
Restriction Requirement mailed Nov. 19, 2014 in co-pending U.S. Appl. No. 13/413,032, now published as US Patent Application Publication No. US 2012/0182035.
Response to Restriction Requirement filed Nov. 20, 2014 in co-pending U.S. Appl. No. 13/413,032, now published as US Patent Application Publication No. US 2012/0182035.
Notice of Allowance and Fee(s) Due mailed Jan. 5, 2015 in co-pending U.S. Appl. No. 13/413,032, now published as US Patent Application Publication No. US 2012/0182035.
Office Action mailed Apr. 30, 2013 in co-pending U.S. Appl. No. 13/413,724, now published as US Patent Application Publication No. US 2012/0168948.
Amendment and Response filed May 7, 2013 in co-pending U.S. Appl. No. 13/413,724, now published as US Patent Application Publication No. US 2012/0168948.
Notice of Non-Compliant Amendment mailed May 16, 2013 in co-pending U.S. Appl. No. 13/413,724, now published as US Patent Application Publication No. US 2012/0168948.
Revised Amendment and Response filed May 17, 2013 in co-pending U.S. Appl. No. 13/413,724, now published as US Patent Application Publication No. US 2012/0168948.
Office Action mailed Sep. 16, 2013 in co-pending U.S. Appl. No. 13/413,724, now published as US Patent Application Publication No. US 2012/0168948.
Amendment and Response filed Nov. 20, 2013 in co-pending U.S. Appl. No. 13/413,724, now published as US Patent Application Publication No. US 2012/0168948.
Final Office Action mailed Feb. 14, 2014 in co-pending U.S. Appl. No. 13/413,724, now published as US Patent Application Publication No. US 2012/0168948.
Amendment and Response to Final Office filed Feb. 26, 2014 in co-pending U.S. Appl. No. 13/413,724, now published as US Patent Application Publication No. US 2012/0168948.
Advisory Action mailed Mar. 28, 2014 in co-pending U.S. Appl. No. 13/413,724, now published as US Patent Application Publication No. US 2012/0168948.
Second Amendment and Response filed Apr. 14, 2014 in co-pending U.S. Appl. No. 13/413,724, now published as US Patent Application Publication No. US 2012/0168948.
Notice of Allowance and Fee(s) Due mailed May 9, 2014 in co-pending U.S. Appl. No. 13/413,724, now published as US Patent Application Publication No. US 2012/0168948.
Restriction Requirement mailed Apr. 10, 2014 in co-pending U.S. Appl. No. 13/418,853, now published as US Patent Application Publication No. US 2012/0244728.
Response to Restriction Requirement filed Apr. 23, 2014 in co-pending U.S. Appl. No. 13/418,853, now published as US Patent Application Publication No. US 2012/0244728.
Office Action mailed Jun. 26, 2014 in co-pending U.S. Appl. No. 13/418,853, now published as US Patent Application Publication No. US 2012/0244728.
Amendment and Response filed Aug. 26, 2014 in co-pending U.S. Appl. No. 13/418,853, now published as US Patent Application Publication No. US 2012/0244728.
Final Office Action mailed Oct. 28, 2014 in co-pending U.S. Appl. No. 13/418,853, now published as US Patent Application Publication No. US 2012/0244728.
Notice of Allowance and Fee(s) Due mailed Oct. 2, 2013 in co-pending U.S. Appl. No. 13/448,865, now published as US Patent Application Publication No. US 2012/0199985.
Notice of Allowance and Fee(s) Due mailed Dec. 6, 2013 in co-pending U.S. Appl. No. 14/058,863, now published as US Patent Application Publication No. 2014/0043782.
Office Action mailed Mar. 20, 2014 in co-pending U.S. Appl. No. 14/058,863, now published as US Patent Application Publication No. 2014/0043782.
Office Action mailed Mar. 27, 2014 in co-pending U.S. Appl. No. 14/058,863, now published as US Patent Application Publication No. 2014/0043782.
Response and Terminal Disclaimer filed Apr. 2, 2014 in co-pending U.S. Appl. No. 14/058,863, now published as US Patent Application Publication No. 2014/0043782.
Notice of Allowance and Fee(s) Due mailed Apr. 17, 2014 in co-pending U.S. Appl. No. 14/058,863, now published as US Patent Application Publication No. 2014/0043782.
Office Action mailed May 9, 2013 in co-pending U.S. Appl. No. 13/448,914, now published as US Patent Application Publication No. US 2012/0202364.
Amendment and Response filed May 20, 2013 in co-pending U.S. Appl. No. 13/448,914, now published as US Patent Application Publication No. US 2012/0202364.
Notice of Allowance and Fee(s) Due mailed Jul. 28, 2013 in co-pending U.S. Appl. No. 13/448,914, now published as US Patent Application Publication No. US 2012/0202364.
Office Action mailed Oct. 7, 2013 in co-pending U.S. Appl. No. 13/969,953, now issued as U.S. Pat. No. 8,704,377.
Amendment and Response and Terminal Disclaimer filed Nov. 20, 2013 in co-pending U.S. Appl. No. 13/969,953, now issued as U.S. Pat. No. 8,704,377.
Final Office Action mailed Dec. 20, 2013 in co-pending U.S. Appl. No. 13/969,953, now issued as U.S. Pat. No. 8,704,377.
Amendment and Response to Final Office filed Dec. 30, 2013 in co-pending U.S. Appl. No. 13/969,953, now issued as U.S. Pat. No. 8,704,377.
Notice of Allowance and Fee(s) Due mailed Jan. 22, 2014 in co-pending U.S. Appl. No. 13/969,953, now issued as U.S. Pat. No. 8,704,377.
Co-pending U.S. Appl. No. 14/327,916 titled Matrix Defined Electrical Circuit Structure, filed Jul. 10, 2014.
Co-pending U.S. Appl. No. 14/408,205 titled Hybrid Printed Circuit Assembly With Low Density Main Core and Embedded High Density Circuit Regions, filed Dec. 15, 2014.
Co-pending U.S. Appl. No. 14/408,039 titled High Speed Circuit Assembly With Integral Terminal and Mating Bias Loading Electrical Connector Assembly, filed Dec. 15, 2014.
Co-pending U.S. Appl. No. 14/408,338 titled Semiconductor Socket With Direct Selective Metalization, filed Dec. 16, 2014.
Final Office Action mailed Mar. 16, 2015 in co-pending U.S. Appl. No. 13/320,285, now published as US Patent Application Publication No. US 2012/0055702.

(56) References Cited

OTHER PUBLICATIONS

Final Office Action mailed Feb. 10, 2015 in co-pending U.S. Appl. No. 13/318,382, now published as US Patent Application Publication No. US 2012/0043130.
Amendment and Response with RCE filed Feb. 5, 2015 in co-pending U.S. Appl. No. 13/319,158, now published as US Patent Application Publication No. 2012/0051016.
Notice of Allowance and Fee(s) Due mailed Feb. 9, 2015 in co-pending U.S. Appl. No. 13/643,436, now published as US Patent Application Publication No. 2013/0105984.
Restriction Requirement mailed Feb. 12, 2015 in co-pending U.S. Appl. No. 13/700,639, now published as US Patent Application Publication No. 2013/0078860.
Response to Restriction Requirement filed Feb. 24, 2015 in co-pending U.S. Appl. No. 13/700,639, now published as US Patent Application Publication No. 2013/0078860.
Amendment and Response filed Feb. 3, 2015 in co-pending U.S. Appl. No. 13/879,783, now published as US Patent Application Publication No. 2013/0223034.
Amendment and Response filed Mar. 10, 2015 in co-pending U.S. Appl. No. 13/879,883, now published as US Patent Application Publication No. 2013/0244490.
Restriction Requirement mailed Jan. 22, 2015 in co-pending U.S. Appl. No. 13/880,231, now published as US Patent Application Publication No. 2013/0210276.
Response to Restriction Requirement filed Jan. 27, 2015 in co-pending U.S. Appl. No. 13/880,231, now published as US Patent Application Publication No. 2013/0210276.
Office Action mailed Feb. 27, 2015 in co-pending U.S. Appl. No. 13/410,943, now published as US Patent Application Publication No. US 2012/0161317.
Amendment and Response with RCE filed Jan. 28, 2015 in co-pending U.S. Appl. No. 13/418,853, now published as US Patent Application Publication No. US 2012/0244728.
Office Action mailed Feb. 20, 2015 in co-pending U.S. Appl. No. 13/418,853, now published as US Patent Application Publication No. US 2012/0244728.
Co-pending U.S. Appl. No. 14/621,663 titled High Performance Surface Mount Electrical Interconnect, filed Feb. 13, 2015.
Notice of Allowance and Fee(s) Due mailed Apr. 9, 2015 in co-pending U.S. Appl. No. 13/266,573, now issued as U.S. Pat. No. 9,054,097.
Notice of Allowance and Fee(s) Due mailed Apr. 13, 2015 in co-pending U.S. Appl. No. 13/318,200, now published as US Patent Application Publication No. US 2012/0056332.
Notice of Allowance and Fee(s) Due mailed May 18, 2015 in co-pending U.S. Appl. No. 14/086,029, now issued as U.S. Pat. No. 9,076,884.
Final Office Action mailed Jun. 30, 2015 in co-pending U.S. Appl. No. 13/318,369, now published as US Patent Application Publication No. US 2012/0043119.
Office Action mailed Apr. 23, 2015 in co-pending U.S. Appl. No. 13/319,158, now published as US Patent Application Publication No. 2012/0051016.
Office Action mailed Apr. 2, 2015 in co-pending U.S. Appl. No. 13/700,639, now published as US Patent Application Publication No. 2013/0078860.
Final Office Action mailed Apr. 23, 2015 in co-pending U.S. Appl. No. 13/879,783, now published as US Patent Application Publication No. 2013/0223034.
Notice of Allowance and Fee(s) Due mailed May 28, 2015 in co-pending U.S. Appl. No. 13/879,883, now published as US Patent Application Publication No. 2013/0244490.
Office Action mailed May 22, 2015 in co-pending U.S. Appl. No. 13/880,231, now published as US Patent Application Publication No. 2013/0210276.
Office Action mailed May 4, 2015 in co-pending U.S. Appl. No. 13/880,231, now published as US Patent Application Publication No. 2013/0210276.
Notice of Allowance and Fee(s) Due mailed Jun. 4, 2015 in co-pending U.S. Appl. No. 13/410,914, now published as US Patent Application Publication No. US 2012/0164888.

\* cited by examiner

PERFORMANCE ENHANCED SEMICONDUCTOR SOCKET

CROSS-REFERENCE TO RELATED APPLICATIONS

This application claims the benefit of U.S. Provisional Application No. 61/914,179, filed Dec. 10, 2013, the disclosure of which is hereby incorporated by reference.

The present application is a continuation-in-part of U.S. patent application Ser. No. 13/700,639, entitled Electrical Connector Insulator Housing, filed Nov. 28, 2012, which is a national stage application under 35 U.S.C. §371 of International Application No. PCT/US2011/038845, titled Electrical Connector Insulator Housing, filed Jun. 2, 2011, which claims the benefit of U.S. Provisional Application No. 61/351,114, entitled Electrical Connector Insulator Housing, filed Jun. 3, 2010, all of which are hereby incorporated by reference in their entireties.

This application is a continuation-in-part of U.S. patent application Ser. No. 13/410,914, titled METALIZED PAD TO ELECTRICAL CONTACT INTERFACE, filed Mar. 2, 2012, which claims priority to U.S. Provisional Application No. 61/448,288, filed Mar. 2, 2011, both of which are hereby incorporated by reference in their entireties.

This application is a continuation-in-part of U.S. patent application Ser. No. 13/412,870, titled Selective Metalization of Electrical Connector or Socket Housing, filed Mar. 6, 2012, which claims priority to U.S. Provisional Application No. 61/449,889, filed Mar. 7, 2011, both of which are hereby incorporated by reference in their entireties.

TECHNICAL FIELD

The present disclosure relates to a test socket for IC devices with features that can be altered to tune the characteristic impedance of the signal path. The present impedance tuning can be achieved using proven metallic contact members that provide reliable elastic deformation or compliance properties.

BACKGROUND OF THE INVENTION

Traditional IC sockets are generally constructed of an injection molded plastic insulator housing that includes stamped and formed copper alloy contact members stitched or inserted into recesses. The assembled IC socket is then generally processed through a reflow oven to attach solder balls to the contact members. During final assembly the contact pads on the printed circuit board ("PCB") are printed with solder paste or flux and the solder balls on the IC socket are placed in registration with the contact pads. The assembly is then reflowed and the solder balls essentially weld the IC socket to the PCB.

During use, an IC socket receives an IC device, such as a packaged integrated circuit. The contact members electrically couple the terminals on the IC device with the corresponding terminal on the PCB. The terminals on the IC device are typically held against the contact members by applying a load, which is expected to maintain intimate contact and reliable circuit connection throughout the life of the system without a permanent connection. As a result, the IC device can be removed or replaced without the need for reflowing solder connections.

These types of IC sockets and interconnects have been produced in high volume for many years. As IC devices advance to next generation architectures traditional IC sockets have reached mechanical and electrical limitations that require alternate methods.

As processors and systems have evolved, several factors have impacted the design of traditional IC sockets. Increased terminal counts, reductions in the distance between the contacts known as terminal pitch, and signal integrity have been main drivers that impact the socket and contact design. As terminal counts go up, the IC package essentially gets larger due to the additional space needed for the terminals. As the package grows larger, costs go up and the relative flatness of the package and corresponding PCB require compliance between the contact and the terminal pad to accommodate the topography differences and maintain reliable connection.

Package producers tend to drive the terminal pitch smaller so they can reduce the size of the package as well as the flatness effects. As the terminal pitch reduces, the available area to place a contact is also reduced, which limits the space available to locate a spring or contact member which can deflect without touching a neighbor. In order to maximize the length of the spring so that it can deflect the proper amount without damage, the thickness of the insulating walls within the plastic housing is reduced which increases the difficulty of molding as well as the latent stress in the molded housing, resulting in warpage during the heat applied during solder reflow. For mechanical reasons, the contact designs desire to have a long contact that has the proper spring properties. Long contact members tend to reduce the electrical performance of the connection by creating a parasitic effect that impacts the signal as it travels through the contact. Other effects such as contact resistance impact the self-heating effects as current passes through power delivering contacts, and the small space between contacts can cause distortion as a nearby contact influences the neighbor which is known as cross talk. Traditional socket methods are able to meet the mechanical compliance requirements of today's needs, but they have reached an electrical performance limit.

Traditional test sockets are manufactured from bulk plastic material that is machined to provide device location features as well as positions for the electrical contacts that can be stamped and formed, blanked, wire electro-discharge machining processed, or constructed from conductive elastomer, coil spring probes, or several variations. The predominant contact type used in test sockets is the spring probe, which basically consists of two or more metal members that engage each other to create the electrical path biased by a coil spring that provides normal and return force.

Next generation systems will operate above 5 GHz and beyond and the existing interconnects will not achieve acceptable performance levels without significant revision. A major issue with the use of spring probes in test sockets is the electrical performance is degraded by the coil spring which is an inductor, as well as the potential capacitance of the metal members and the relatively high contact resistance due to the various sliding connection point.

BRIEF SUMMARY OF THE INVENTION

The present disclosure is directed to an enhanced test socket with electrical and mechanical enhancements to address the challenges of next generation interconnect requirements. The present socket housing employs materials with varying dielectric constant and optional metallization in a selective manner to provide impedance tuning characteristics through the electrical path. The present test socket can use proven metallic contact members that provide reliable elastic deformation or compliance properties.

In one embodiment, the socket housing is created by drilling a conventional PCB type material known as a core. In another embodiment, the socket housing can be constructed from molded or machined plastic, or one or more layers of imaged dielectric material. The various socket housing fabrication techniques can be used alone or in combination.

In the drilled core example, the cross section of the socket housing is made up of appropriately thick layers of core material. The preferred feature in the core to allow for contact insertion is a round diameter to utilize low cost drilling techniques used in the printed circuit industry. This basic core format can be assembled with simply drilled cores stacked to create the desired cross section. The socket housing version can be enhanced by adding dielectric material to the holes. If the holes are molded, fine features can be imaged into the dielectric to create a geometry that would require far too complicated to machine.

The further enhancement of the principle is to take the cores of varying dielectric constant and optionally metalize them in a selective manner that provides impedance tuning characteristics through the electrical path, such as by adding capacitance/inductance where needed or removing capacitance/inductance where desired to result in the desired ratio between the two which effectively tunes the characteristic impedance of the signal path. In addition, the construction of the socket housing can include a coaxial interface by adding metallization that replicates the effect of the outer conductor of a coaxial cable, while the contact member replicates the center conductor. The geometries can be designed such that an appropriate amount of dielectric such as air, Teflon, or some other dielectric material of the appropriate dielectric constant surrounds the majority of the contact member to create the tuned environment.

The present disclosure includes embodiments using spring probe style contact members because of their superior mechanical performance. At the same time, spring probe contact members also exhibit poor electrical performance due to the coil spring and the general metal structure. In one embodiment, a stack of drilled cores are assembled around the spring probe contact members in a compression mounted configuration, with the contact tips extending above and below the core surfaces to provide an electrical contact point between two mating circuits or packaged semiconductor devices. The stacked or layered socket housing reduces cost and permits the ability to mix and match the material stack based upon dielectric constant. Applicant has found that signal integrity of a spring probe contact member is greatly improved by varying the dielectric constant from layer to layer, the thickness of the layers, and the air gap around the contact member.

The present socket housing can be treated as a system of its own by incorporating electrical devices or other passive and active functions, such as for example, ground planes, power planes, electrical connections to other circuit members, dielectric layers, conductive traces, transistors, capacitors, resistors, RF antennae, shielding, filters, signal or power altering and enhancing devices, memory devices, embedded IC, and the like. In some embodiments, the electrical devices can be formed using printing technology, adding intelligence to the interconnect assembly.

The socket housing preferably includes a plurality of layers. In one embodiment, metalized layers are formed between layers that electrically shield the contact members. Circuit traces are optionally located between layers. In one embodiment, metalized layers are formed on surfaces of the recesses that electrically couple with the contact members. In another embodiment, at least one dielectric layer is printed on the electrical interface.

One embodiment is directed to a test socket for IC devices includes a multi-layered socket housing with at least one center layer and first and second surface layers. The first and second surface layers have a thickness and dielectric constant less than that of the center layers. A plurality of contact members are located in center openings in the center layer with distal ends extending into openings in the first and second layers. The distal ends of the contact members have at least one dimension greater than the openings in the first and second surface layers to retain the contact members in the socket housing. The contact members include center portions with major diameters less than the diameters of the center openings, such that an air gap is maintained between the contact members and the center layer.

In another embodiment the test socket for IC devices includes a multi-layered socket housing. A first surface layer is located on the first major surface of a center layer. The first surface layer has a thickness less than the center layer thickness. A plurality of first surface layer openings are aligned with center layer openings. The first surface layer openings having diameters less than the diameters of the center layer openings. The first surface layer has a dielectric constant less than the center layer dielectric constant. A second surface layer is located on the second major surface of the center layer. The second surface layer has a thickness less than the center layer thickness. A plurality of second surface layer openings are aligned with the center layer openings. The second surface layer openings having diameters less than the diameters of the center layer openings. The second surface layer has a dielectric constant less than the center layer dielectric constant. A plurality of contact members are located in the center openings with distal ends extending into the first and second layer openings to permit electrical coupling with the IC devices. The distal ends of the contact members having at least one dimension greater than the first and second surface layer opening diameters to retain the contact members in the socket housing. The contact members include center portions with major diameters less than the center opening diameters. The first and second surface layer openings retain the contact members in the center openings such that an air gap is maintained between the contact members and the center layer.

In one embodiment, a metal layer is deposited on inside surfaces of the center layer openings and surrounding portions of the contact members. The metal layer may be at least one annular ring surrounding the contact members and located between layers of the multi-layered socket housing. The annular ring of metal may be electrically coupled to the metal layer surrounding the contact members. The metal layer surrounding the contact members optionally extends through the first and second surface layer to form contact pads on exposed surfaces of the first and second surface layers. In another embodiment, at least one annular ring of metal surrounds the contact members and is located between layers of the multi-layered socket housing.

In one embodiment, the center layer thickness is about two times greater than the first or second surface layer thicknesses. In another embodiment, the center layer thickness is about five times greater than the first or second surface layer thicknesses. In another embodiment, the center layer openings extend along at least 60% of an overall length of the contact members.

In one embodiment, the center layer dielectric constant is at least 30% greater than the first or second surface layer dielectric constants. The center layer opening diameters are preferably at least 125%, or at least 150%, greater than the major diameters of the contact members.

The multi-layered socket housing may include layers of conductive, non-conductive, or semi-conductive materials.

DETAILED DESCRIPTION OF THE INVENTION

Figure 1:
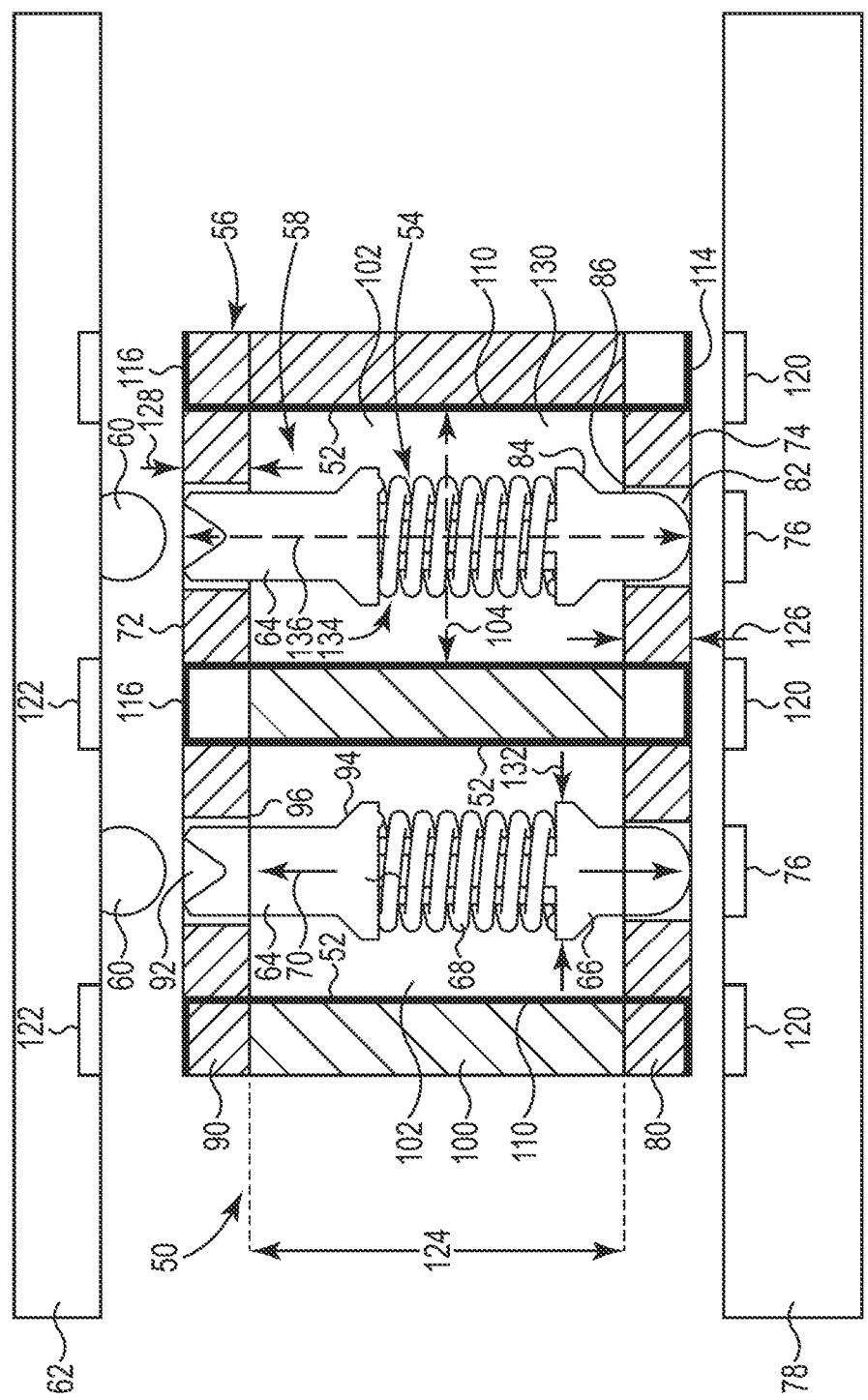
FIG. 1 is a cross sectional view of a test socket with co-axial shielding surrounding spring contact members in accordance with an embodiment of the present disclosure.

FIG. 1 is a sectional view of a test socket 50 with contact members 54 in accordance with an embodiment of the present disclosure. Socket housing 56 includes a plurality of openings 58 arranged to correspond with contacts 60 on integrated circuit device 62. In the illustrated embodiment, the contacts 60 are solder balls.

In the illustrated embodiment, the contact members 54 are spring contact members that provide superior mechanical performance in forming electrical connections with IC devices 62 and PCB 78. In one embodiment, shielding 52 surrounds the contact members 54. The spring contact members 54 are of a conventional structure with an upper portion 64 that slides axially relative to lower portion 66. Spring member 68 biases the upper portion 64 away from the lower portion 66 along axis 70. In application, upper portion 66 extends above top surface 72 of the socket housing 56 to engage with contact members 60 on the IC device 62. Simultaneously, lower portion 66 extends beyond lower surface 74 of the socket housing 56 to engage with contact pads 76 on the PCB 78.

Socket housing 56 is a multi-layered structure with at least a lower surface layer 80 that extends over through holes 58. Openings 82 in the lower surface layer 80 are sized to permit lower portions 66 of the spring contact members 54 to extend beyond surface 74. The contact member 54 includes at least one dimension, such as shoulder 84, that engages with edges 86 on the lower surface layer 80 to limit how far the spring contact members 54 extends beyond surface 74 and to prevent the spring contact members 54 from falling out of the socket housing 56 through the holes 82.

Similarly, upper surface layer 90 includes openings 92 that permit the upper portions 64 to extend beyond surface 72. The upper portion 64 includes at least one dimension, such as shoulders 94, that engages with surface 96 on the upper surface layer 90 to limit how far the spring contact members 54 extend beyond surface 72 and to prevent the spring contact members 54 from falling out of the socket housing 56 through the holes 92.

The openings 82, 92 in the surface layers 80, 90 are in fluid communication with the openings 102 in the center layer 100. In the illustrated embodiment, the openings 102 in the center layer 100 have a cross-sectional dimension or diameter 104 greater than that of the openings 82, 92. The openings 102 in the center layer 100 are filed with a dielectric, such as air, Teflon, or some other dielectric material. The surface layers 80, 90, 100 are assembled to capture the spring contact members 54 in the openings 102. As will be discussed below, the openings 82, 92 are preferably positioned to retain the contact members 54 within the opening 102, without contacting the shielding 52.

In one embodiment, the socket housing 56 is assembled a layer-by-layer basis. The discrete surface layers 80, 90, 100 can be bonded using a variety of techniques, such as adhesive bonding, ultrasonic or solvent welding, and other techniques known to those in the art. In another embodiment, some of the layers can be molded or machined as a subassembly. For example, layers 90 and 100 can be molded or machined as an assembly. After the contact members 54 are inserted in the openings 102, the layer 80 is applied. Similarly, the layers 80 and 100 can be molded or machined as an assembly, with the layer 90 added after insertion of the contact members 54.

The spring contact members 54 exhibit poor electrical performance due to the coil spring and the general metal structure. Sidewalls 110 of the openings 102 are metalized to provide shielding 52 for the spring contact members 54. In the illustrated embodiment, the shielding 52 preferably surrounds the spring contact members 54 in a co-axial configuration. The shielding 52 extends through the layers 80, 90, 100 and preferably extends onto the surfaces 72, 74 in the form of electrical ground pads 114, 116.

In one embodiment, the ground pads 114 on the socket housing 56 electrically couple with corresponding grounding pads 120 on the PCB 78. In another embodiment, the ground pads 116 on the socket housing 56 electrically couple with corresponding ground pads 122 on the IC device 62.

By modifying the dielectric properties of the socket housing 56 in a region around the contact members 54 at specific points relative to the contact geometries, changes in the capacitive field can be made to offset the inductance of the contact members 54. This "impedance tuning" can be done using a variety of techniques, including adding a continuous layer of a higher dielectric constant material, by varying the dielectric constants of the housing layers 80, 90, 100, or by adding localized metal at multiple points within a layer or region adjacent to the contact members 54. In the context of the present multi-layered socket housing, these changes may include increasing the thickness of the center layer 100 relative to the surface layers 80, 90, selecting a material for the center layer with a higher dielectric constant, maintain an air gap between the center layer 100 and the contact members 54, and/or adding metal to portions of the socket housing to surround the contact members 54, each of which is discussed below. The various structures for impedance tuning may be used alone or in combination with each other. The various structures for impedance tuning may be used alone or in combination with each other.

In one embodiment, impedance tuning is achieved by making thickness 124 of the center layer 100 about 2× greater than thicknesses 126, 128 of the surface layers 80, 90, respectively. In another embodiment, the center layer 100 has a thickness that is about 3× to about 5× thicker than the thicknesses 126, 128 of the surface layers 80, 90. Where the center layer 100 includes multiple layers (see e.g., FIG. 2A), reference to the thickness of the center layer typically means the combined thickness of all the center layers.

The thickness of the center layer 100 may also be considered in the context of the overall length 136 of the contact members 54. The center layer 100 preferably surrounds a substantial portion, and at least center portion 134, of the contact members 54. The center layer(s) 100 preferably have a thickness 124 sufficient to extend along at least 60%, and more preferably along 75%, of an overall length 136 of the contact members 54.

In another embodiment, impedance tuning is achieved by constructing the center layer 100 from a material that has a higher dielectric constant greater than the dielectric constants for the surface layers 80, 90. Dielectric constant refers to the relative permittivity of a material measured as the ratio of the capacitance of a capacitor using that material as a dielectric, compared to a similar capacitor that has vacuum as its dielectric. For example, the dielectric constant of a vacuum at room temperature under 1 kHz is defined as having a value of 1.0. The dielectric constant of polyimide is about 3.4 and the dielectric constant of liquid crystal polymer is about 3.0-3.3 (tested according to ASTM D150). FR4, on the other hand, has a dielectric constant of about 4.7.

In one embodiment, the center layer 100 is constructed from a material that has a dielectric constant that is about 20% greater than the dielectric constants for the surface layers 80, 90. In another embodiment, the center layer 100 is constructed has a higher dielectric constant that is about 30%, or about 40%, greater than the dielectric constants for the surface layers 80, 90.

In another embodiment, impedance tuning is achieved by maintaining air gap 130 between center portion 134 of the contact member 54 and the sidewalls 110 of the center layer 100. In one embodiment, the openings 102 in the center layer 100 has diameters 104 that are about 1.5× to about 2× greater than major diameter 132 of the contact members 54. The surface layers 80, 90 serve to retain the contact members 54 generally in the middle of the center openings 102 so as to maintain the air gap 130.

In another embodiment, impedance tuning is achieved by adding a ring of copper either vertical or lateral at points around the contact members 54. In the embodiment of FIG. 1, shielding 52 surrounds the contact members 54, as discussed above.

Figure 2:
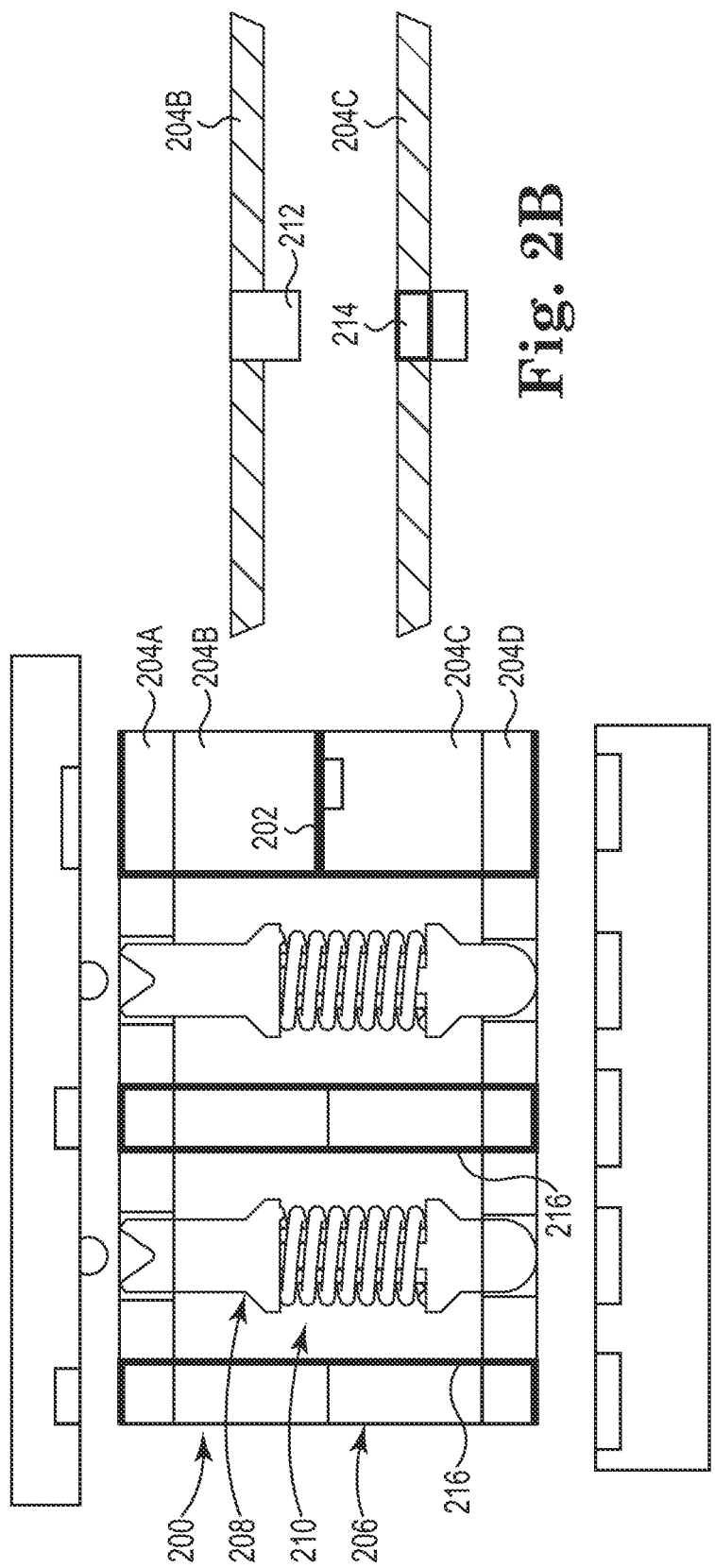
FIG. 2A illustrates a test socket with electrical features that couple adjacent layers of the socket housing in accordance with an embodiment of the present disclosure.
FIG. 2B is a sectional view of the electrical features coupling adjacent layers of the socket housing of FIG. 2A.

FIGS. 2A and 2B are sectional views of an alternate test socket 200 with ground plane 202 between layers 204B, 204C in accordance with an embodiment of the present disclosure. The ground plane 202 acts as a lateral ring of copper surrounding the contact members 208 for impedance tuning purposes. The socket housing 206 includes a plurality of layers 204A, 204B, 204C, 204D. As discussed herein, upper and lower surface layers 204A, 204D capture the contact members 208 in the openings 210. The ground plane 202 can be used alone or in combination with vertical shielding 216 in the openings 210 surrounding the contact members 208.

As best illustrated in FIG. 2B, the layer 204B includes copper pillar terminals 212 that plug into corresponding vias or holes 214 in the layer 204C. The socket housing 206 is sandwiched in such a way that the copper pillar plated posts 212 act as stitching vias to connect ground planes 202, 216. In one embodiment, the test socket 200 is assembled on a layer-by-layer basis. Alternatively, the layers 204A, 204B, 204C can be molded or machined as an assembly, with the layer 204D added after the contact members 208 are inserted.

Figure 3:
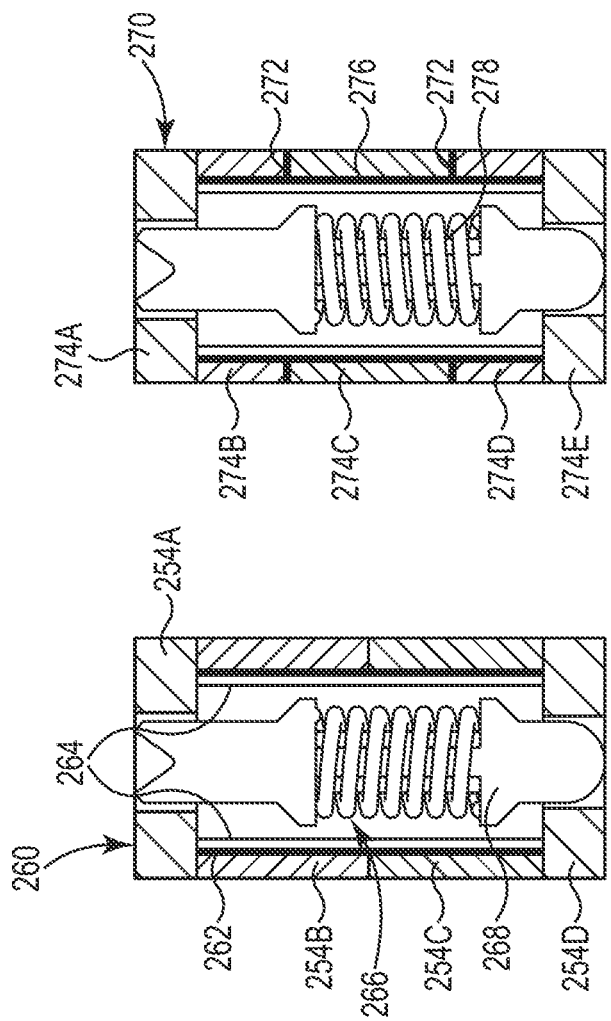
FIGS. 3A through 3C illustrate alternate shielding arrangements in accordance with an embodiment of the present disclosure.

FIG. 3A illustrates alternate embodiments for creating an impedance tuning by adding capacitance in specific regions through a socket housing 250 to offset the inductance of the contact member 252 in accordance with an embodiment of the present disclosure. The layered construction of the socket housing 250 permits each layer 254A, 254B, 254C, 254D to be a different dielectric constant materials. The layers 254B, 254C are preferably constructed from high dielectric constant materials than the layers 254A, 254D. In one embodiment, the layers 254B, 245C are constructed from materials with dielectric constants that are about 20% to about 40% greater than the dielectric constants for the layers 254A, 254D. In one embodiment, the layer 254B has a dielectric constant that is about 5% to about 20% greater than the dielectric constant of the layer 254C.

FIG. 3B illustrates a socket housing 260 with a metalized region 262 surrounding center portion 266 of the contact member 268. An optional passivation layer 264 is located over the metalized region 262. In addition to the metalized region 262, the layers 254A-254D may be constructed from materials with different dielectric constants, as discussed herein.

FIG. 3C illustrates a socket housing 270 with metalized regions 272 forming lateral copper rings between layers 274A-27E that create localized capacitance. The metalized regions 272 are optionally coupled to vertical cylindrical copper structures formed by metalized regions 276 surrounding the contact member 278. Again, the layers 274A-274E may also be constructed from materials with different dielectric constants.

Figure 4:
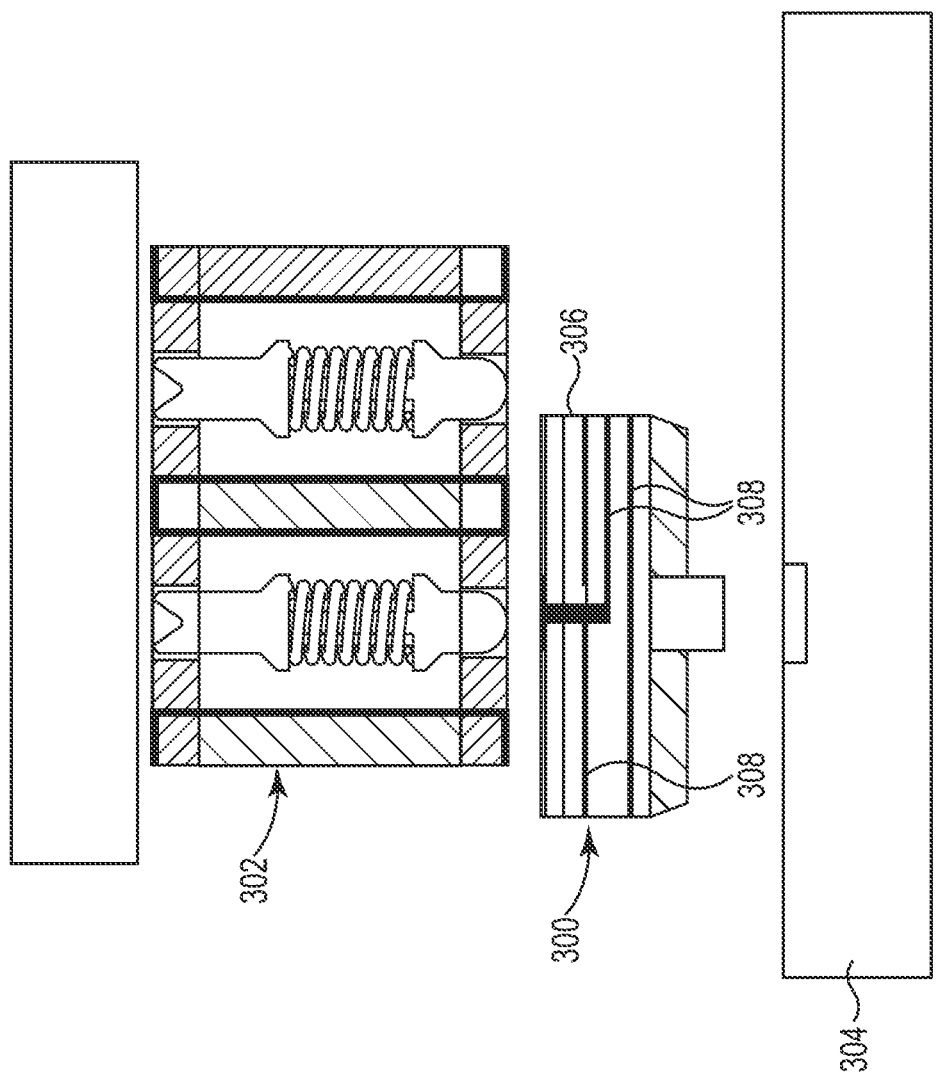
FIG. 4 illustrates a density high density routing interposer located between a test socket and a PCB in accordance with an embodiment of the present disclosure.

FIG. 4 illustrates an embodiment in which a high density routing interposer 300 is located between a test socket 302 and the PCB 304 in accordance with an embodiment of the present disclosure. In the illustrate embodiment, the test socket 302 is the same as illustrated in FIG. 1. The interposer 300 enhances the signal path by creating a thin platform to add additional impedance tuning, decoupling or route high speed signals external to the main PCB. The metalization 308 within the core stack 306 also provides a platform for adding further electrical function, embedded passive or active function either in a soldered or solder-less configuration.

Figure 5:
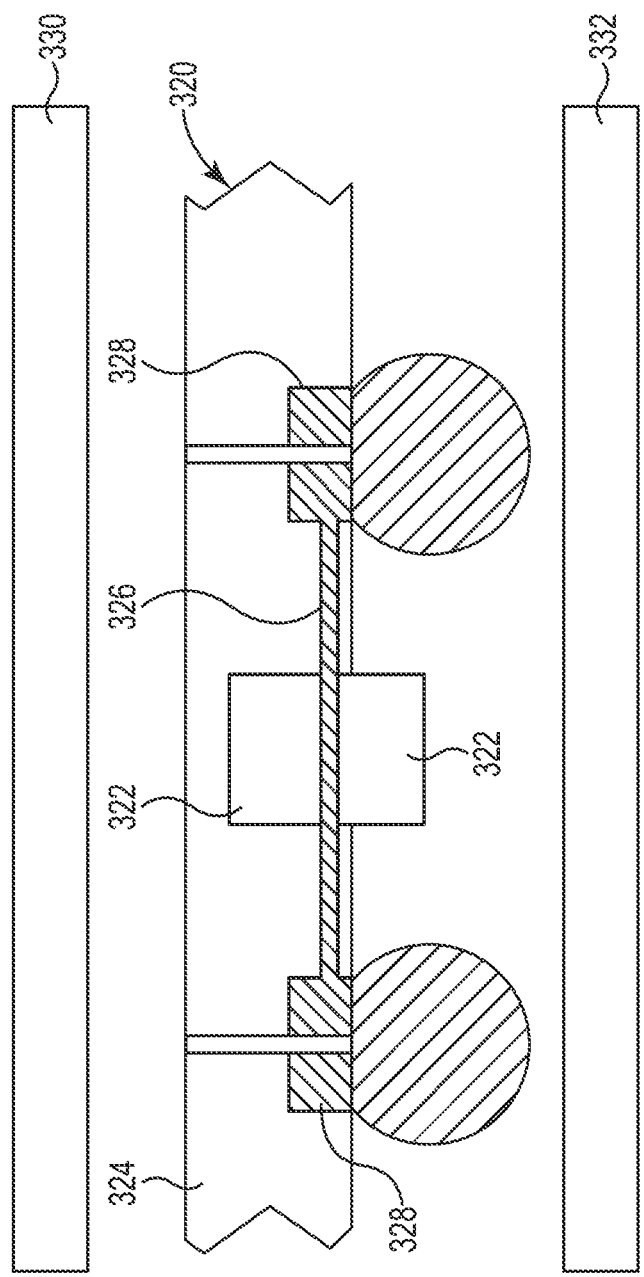
FIG. 5 illustrates a test socket with on-board electrical devices in accordance with an embodiment of the present disclosure.

FIG. 5 illustrates socket housing 320 with electrical devices 322, such as for example, internal decoupling capacitors, located on substrate 324 in accordance with an embodiment of the present disclosure. Embedded passive enhancements can be added as discrete components or printed materials which result in the desired effect, potentially reducing the need for discrete components on the PCB while moving decoupling closer to the IC device 330, to increase performance. For example, internal decoupling capacitance can be printed within the socket housing 320 and potentially reduce or replace discrete components on the IC device 330 and or the PCB 332 itself.

Printed conductive traces 326 electrically couple the electrical devices 322 to one or more of the contact pads 328. The electrical devices 322 can be added as discrete components or printed materials, reducing the need for discrete components on the PCB 332 and the IC device 330. Locating the electrical devices 322 in the socket housing 320 permits integrated circuit manufactures to reduce or eliminate the capacitors currently located on the IC device 330 and printed circuit board 332. This shift can greatly reduce cost and simplify the IC device 330 and printed circuit board 332, while improving performance.

The electrical devices 322 can be a power plane, ground plane, capacitor, resistor, filters, signal or power altering and enhancing device, memory device, embedded IC, RF antennae, and the like. The electrical devices 322 can be located on either surface of the substrate 324, or embedded therein. The electrical devices 322 can include passive or active functional elements. Passive structure refers to a structure having a desired electrical, magnetic, or other property, including but not limited to a conductor, resistor, capacitor, inductor, insulator, dielectric, suppressor, filter, varistor, ferromagnet, and the like.

Locating such electrical devices 322 on the socket housing 320 improves performance and enables a reduction in the cost of integrated circuit devices and the PCB 332. Integrated circuit manufactures are limited by the pitch that the PCB 332 can accommodate and still keep the printed circuit board to four layers. The integrated circuit makers can manufacture the integrated circuit device 330 with a smaller pitch, but with the pin counts is so high that the printed circuit board 332 likely requires additional layers in order to route all of the signals. The present electrical interconnect 320 also permits integrated circuit manufactures to reduce the pitch of the contacts on the IC device 330, and perform any required signal routing in the socket housing 320, rather than in the printed circuit board 332 or by adding daughter boards to the system.

Figure 6:
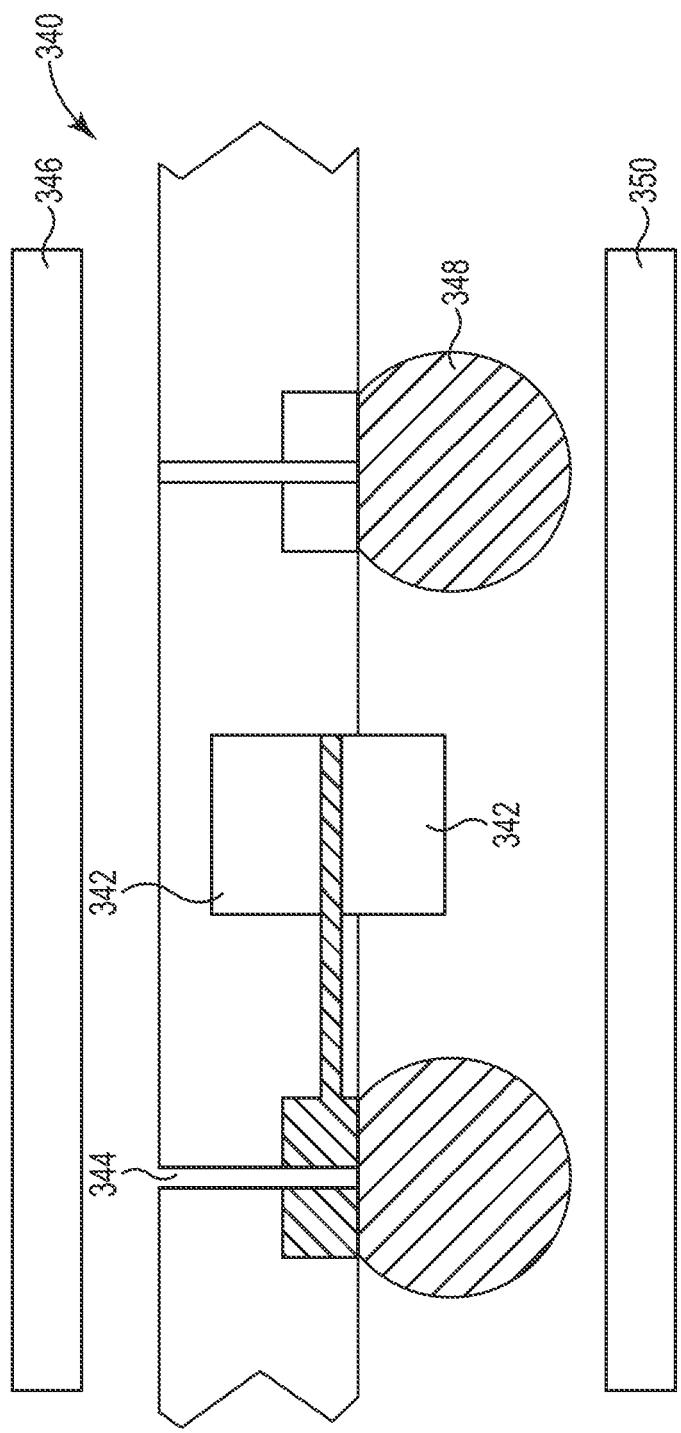
FIG. 6 illustrates an alternate test socket with on-board electrical devices in accordance with an embodiment of the present disclosure.

FIG. 6 illustrates an alternate test socket 340 with on-board electrical devices 342 in accordance with an embodiment of the present disclosure. The decoupling capacitance 342 can be a discrete embedded or printed electrical device. Contact member 344 provides the electrical connection to the capacitor located on the semiconductor device 346 and solder ball 348 provides the electrical connection to the capacitor located on printed circuit board 350.

Figure 7:
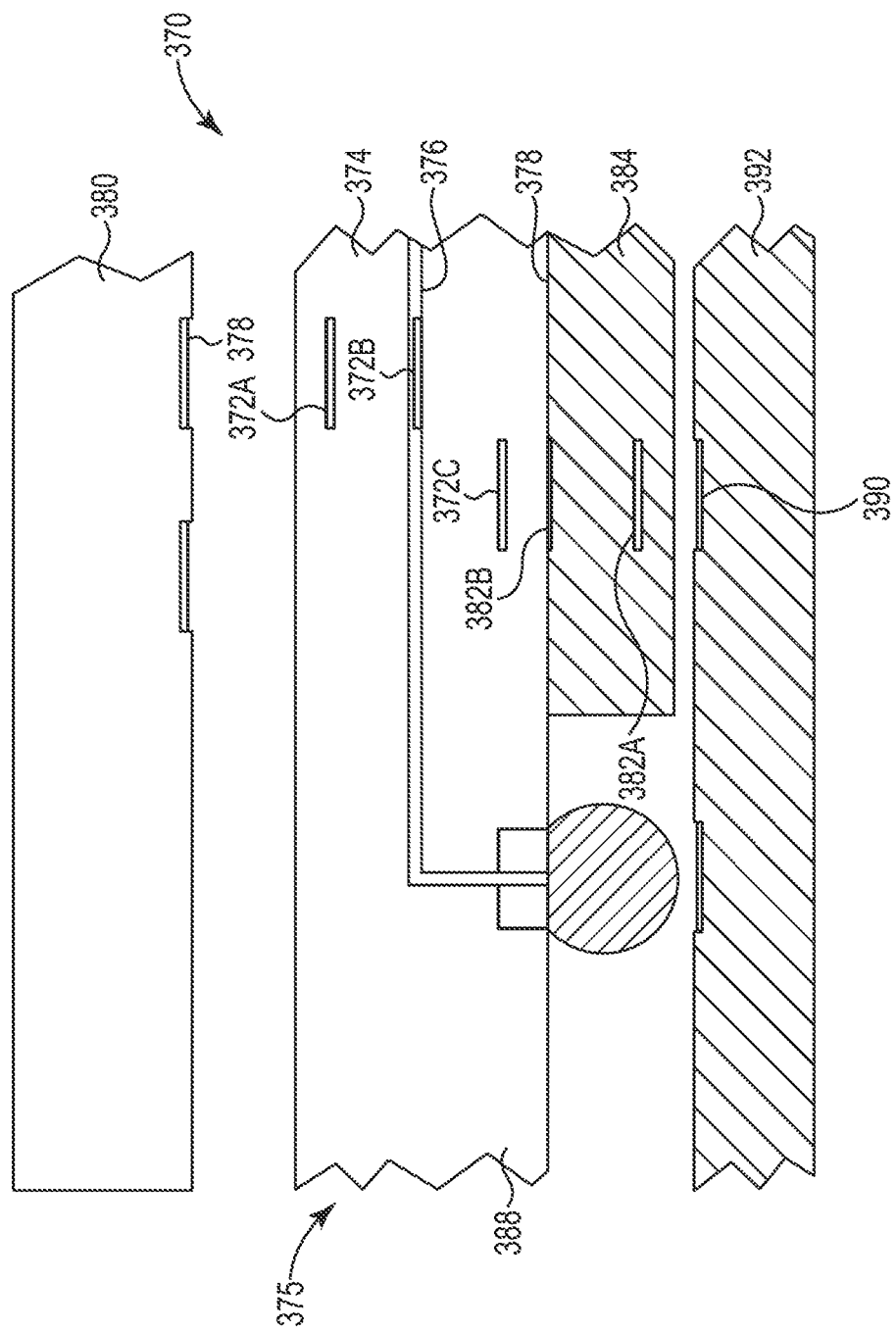
FIG. 7 illustrates a test socket with capacitive coupling in accordance with an embodiment of the present disclosure.

FIG. 7 is a cross-sectional view of test socket 370 with various capacitive coupling features in accordance with another embodiment of the present disclosure. A capacitive coupling feature 372A is embedded in layer 374 of the substrate 375. A capacitive coupling feature 372B is located on second surface 376 of the layer 374. The capacitive coupling features 372A, 372B are positioned to electrically couple with contact pad 378 on integrated circuit device 380. The capacitive coupling 372C is embedded in layer 388.

Capacitive coupling feature 382A is embedded in layer 384 of the substrate 375. Capacitive coupling feature 382B is located on first surface 386 of the layer 384. The capacitive coupling feature 382A is positioned to electrically couple with contact pad 390 on the PCB 392. The various capacitive coupling features in the embodiment of FIG. 6 are optionally formed using inkjet printing technology, aerosol printing technology, or other printing technology.

Where a range of values is provided, it is understood that each intervening value, to the tenth of the unit of the lower limit unless the context clearly dictates otherwise, between the upper and lower limit of that range and any other stated or intervening value in that stated range is encompassed within the embodiments of the disclosure. The upper and lower limits of these smaller ranges which may independently be included in the smaller ranges is also encompassed within the embodiments of the disclosure, subject to any specifically excluded limit in the stated range. Where the stated range includes one or both of the limits, ranges excluding either both of those included limits are also included in the embodiments of the present disclosure.

Unless defined otherwise, all technical and scientific terms used herein have the same meaning as commonly understood by one of ordinary skill in the art to which the embodiments of the present disclosure belong. Although any methods and materials similar or equivalent to those described herein can also be used in the practice or testing of the embodiments of the present disclosure, the preferred methods and materials are now described. All patents and publications mentioned herein, including those cited in the Background of the application, are hereby incorporated by reference to disclose and described the methods and/or materials in connection with which the publications are cited.

The publications discussed herein are provided solely for their disclosure prior to the filing date of the present application. Nothing herein is to be construed as an admission that the present disclosure is not entitled to antedate such publication by virtue of prior invention. Further, the dates of publication provided may be different from the actual publication dates which may need to be independently confirmed.

Other embodiments of the disclosure are possible. Although the description above contains much specificity, these should not be construed as limiting the scope of the disclosure, but as merely providing illustrations of some of the presently preferred embodiments of this disclosure. It is also contemplated that various combinations or sub-combinations of the specific features and aspects of the embodiments may be made and still fall within the scope of the present disclosure. It should be understood that various features and aspects of the disclosed embodiments can be combined with or substituted for one another in order to form varying modes of the disclosed embodiments of the disclosure. Thus, it is intended that the scope of the present disclosure herein disclosed should not be limited by the particular disclosed embodiments described above.

Thus the scope of this disclosure should be determined by the appended claims and their legal equivalents. Therefore, it will be appreciated that the scope of the present disclosure fully encompasses other embodiments which may become obvious to those skilled in the art, and that the scope of the present disclosure is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment(s) that are known to those of ordinary skill in the art are expressly incorporated herein by reference and are intended to be encompassed by the present claims. Moreover, it is not necessary for a device or method to address each and every problem sought to be solved by the present disclosure, for it to be encompassed by the present claims. Furthermore, no element, component, or method step in the present disclosure is intended to be dedicated to the public regardless of whether the element, component, or method step is explicitly recited in the claims.

What is claimed is:

1. A test socket of IC devices comprising:
a multi-layered socket housing including a plurality of dielectric layers comprising:

at least one center layer comprising first and second major surfaces, a center layer thickness, a plurality of center layer openings having center layer opening diameters, and a center layer dielectric constant;

a first surface layer located on the first major surface of the center layer, the first surface layer comprising a first surface layer thickness less than the center layer thickness, a plurality of first surface layer openings aligned with the center layer openings, the first surface layer openings having first surface layer opening diameters less than the center layer opening diameters, the first surface layer comprising a first surface layer dielectric constant less than the center layer dielectric constant;

a second surface layer located on the second major surface of the center layer, the second surface layer comprising a second surface layer thickness less than the center layer thickness, a plurality of second surface layer openings aligned with the center layer openings, the second surface layer openings having second surface layer opening diameters less than the center layer opening diameters, the second surface layer comprising a second surface layer dielectric constant less than the center layer dielectric constant;

a metal layer deposited on inside surfaces of one or more of the center layer openings, the first surface layer opening, and the second surface layer openings; and a plurality of contact members located in the center openings having distal ends extending into the first and second layer openings to permit electrical coupling with the IC devices, the distal ends of the contact members having at least one dimension greater than the first and second surface layer opening diameters to retain the contact members in the socket housing, the contact members comprising center portions with major diameters less than the center opening diameters, the first and second surface layer openings retaining the contact members in the center openings such that an air gap is maintained between the contact members and the center layer.

2. The test socket for IC devices of claim 1 wherein the metal layer comprises shielding for the contact members.

3. The test socket for IC devices of claim 2 comprising at least one annular ring of metal surrounding the contact members and located between layers of the multi-layered socket housing, the annular ring of metal being electrically coupled to the metal layer surrounding the contact members.

4. The test socket for IC devices of claim 2 wherein the metal layer surrounding the contact members extends through the first and second surface layer.

5. The test socket for IC devices of claim 4 comprising contact pads formed on exposed surfaces of the first and, second surface layers electrically coupled to the metal layer surrounding the contact members.

6. The test socket for IC devices of claim 1 comprising at least one annular ring of metal surrounding the contact members and located between layers of the multi-layered socket housing.

7. The test socket for IC devices of claim 1 wherein the center layer thickness is about two times greater than the first or second surface layer thicknesses.

8. The test socket for IC devices of claim 1 wherein the center layer thickness is about five times greater than the first or second surface layer thicknesses.

9. The test socket for IC devices of claim 1 wherein the center layer openings extend along at least 60% of an overall length of the contact members.

10. The test socket for IC devices of claim 1 wherein the center layer dielectric constant is at least 20% greater than the first or second surface layer dielectric constants.

11. The test socket for IC devices of claim 1 wherein the center layer dielectric constant is at least 30% greater than the first or second surface layer dielectric constants.

12. The test socket for IC devices of claim 1 wherein the center layer opening diameters are at least 125% greater than the major diameters of the contact members.

13. The test socket for IC devices of claim 1 wherein the center layer opening diameters are at least 150% greater than the major diameters of the contact members.

14. The test socket for IC devices of claim 1 wherein the multi layered socket housing includes layers of conductive, non-conductive, or semi-conductive materials.

15. A method of making test socket of IC devices comprising the steps of:

forming a multi-layered socket housing including a plurality of dielectric layers, comprising the steps of;

forming at least one center layer with first and second major surfaces, a center layer thickness, a plurality of center layer openings having center layer opening diameters, and, a center layer dielectric constant;

forming a first surface layer on the first major surface of the center layer, the first surface layer comprising a first surface layer thickness less than the center layer thickness, a plurality of first surface layer openings aligned with the center layer openings, the first surface layer openings having first surface layer opening diameters less than the center layer opening diameters, the first surface layer comprising a first surface layer dielectric constant less than the center layer dielectric constant;

forming a second surface layer on the second major surface of the center layer, the second surface layer comprising a second surface layer thickness less than the center layer thickness, a plurality of second surface layer openings aligned with the center layer openings, the second surface layer openings having second surface layer opening diameters less than the center layer opening diameters, the second surface layer comprising a second surface layer dielectric constant less than the center layer dielectric constant;

depositing a metal layer on inside surfaces of one or more of the center layer openings, the first surface layer opening, and the second surface layer openings; and positioning a plurality of contact members in the center openings having distal ends extending into the first and second layer openings to permit electrical coupling with the IC devices, the distal ends of the contact members having at least one dimension greater than the first and second surface layer opening diameters to retain the contact members in the socket housing, the contact members comprising center portions with major diameters less than the center opening diameters, the first and, second surface layer openings retaining the contact members in the center openings such that an air gap is maintained between the contact members and the center layer.

16. The method of claim 15 wherein the first surface layer, the second surface layer and the center layer are discrete structures assembled to form the multi-layered socket housing.

17. The method of claim 15 comprising depositing a metal layer on inside surfaces of the center layer openings to surround portions of the contact members.

18. The method of claim 17 comprising forming contact pads on exposed surfaces of the first and second surface layers electrically coupled to the metal layer surrounding the contact members.

19. The method of claim 15 comprising forming at least one annular ring of metal surrounding the contact members between layers of the multi-layered socket housing.

\* \* \* \* \*